US012709086B2

(12) United States Patent
Kobayashi et al.

(10) Patent No.: US 12,709,086 B2
(45) Date of Patent: Aug. 18, 2026

(54) RESIN LAYER HAVING A SPECIFIC ELASTIC MODULUS, OPTICAL FILM, AND IMAGE DISPLAYING DEVICE

(71) Applicant: DAI NIPPON PRINTING CO., LTD., Tokyo (JP)

(72) Inventors: Atsuhiro Kobayashi, Tokyo (JP); Yousuke Kousaka, Tokyo (JP); Takayuki Fukuda, Tokyo (JP); Kazuya Honda, Tokyo (JP); Kana Yamamoto, Tokyo (JP); Yoshimasa Ogawa, Tokyo (JP); Jun Sato, Tokyo (JP); Gen Furui, Tokyo (JP); Keisuke Yamada, Tokyo (JP); Saori Kawaguchi, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 823 days.

(21) Appl. No.: 17/762,643

(22) PCT Filed: Sep. 28, 2020

(86) PCT No.: PCT/JP2020/036677
§ 371 (c)(1),
(2) Date: Sep. 13, 2022

(87) PCT Pub. No.: WO2021/060560
PCT Pub. Date: Apr. 1, 2021

(65) Prior Publication Data

US 2023/0016838 A1 Jan. 19, 2023

(30) Foreign Application Priority Data

Sep. 27, 2019 (JP) ................................ 2019-177179
Mar. 31, 2020 (JP) ................................ 2020-064107

(51) Int. Cl.
*B32B 5/16* (2006.01)
*B32B 7/022* (2019.01)
(Continued)

(52) U.S. Cl.
CPC .............. *B32B 17/10* (2013.01); *B32B 7/022* (2019.01); *B32B 7/12* (2013.01); *B32B 27/08* (2013.01);
(Continued)

(58) Field of Classification Search
CPC ......... B32B 27/08; B32B 33/00; B32B 37/14; B32B 2457/206
See application file for complete search history.

(56) References Cited

U.S. PATENT DOCUMENTS 10,935,700 B2 * 3/2021 Hashimoto .............. G02B 1/14
12,295,202 B2 * 5/2025 Ogawa .................. H10K 59/40
(Continued)

FOREIGN PATENT DOCUMENTS

CN 109844847 6/2019
JP 2013152488 8/2013
(Continued)

OTHER PUBLICATIONS

Linseis, "Polyamides: An Overview". (Year: 2018).*

*Primary Examiner* — Hoa (Holly) Le
(74) *Attorney, Agent, or Firm* — HSML P.C.

(57) ABSTRACT

One embodiment of the present disclosure provides a resin layer 10 used for an image displaying device, wherein a shear storage elastic modulus G' of the resin layer 10, at 25° C. and frequency range of 500 Hz or more and 1000 Hz or less, is 30 MPa or more and 200 MPa or less, and a glass transition temperature of the resin layer 10 is 50° C. or more.

15 Claims, 3 Drawing Sheets

(51) Int. Cl.

| | |
|---|---|
| ***B32B 7/12*** | (2006.01) |
| ***B32B 17/10*** | (2006.01) |
| ***B32B 27/08*** | (2006.01) |
| ***B32B 27/28*** | (2006.01) |
| ***B32B 27/30*** | (2006.01) |
| ***B32B 27/36*** | (2006.01) |
| ***B32B 27/40*** | (2006.01) |
| ***B32B 33/00*** | (2006.01) |
| ***C08F 220/30*** | (2006.01) |
| ***C08F 222/10*** | (2006.01) |
| ***C08J 5/18*** | (2006.01) |
| ***C08J 7/04*** | (2020.01) |
| ***C08J 7/046*** | (2020.01) |
| ***H05K 5/03*** | (2006.01) |
| ***H10K 59/80*** | (2023.01) |
| *H10K 102/00* | (2023.01) |

(52) U.S. Cl.

CPC .......... *B32B 27/281* (2013.01); *B32B 27/283* (2013.01); *B32B 27/308* (2013.01); *B32B 27/36* (2013.01); *B32B 27/40* (2013.01); *C08F 220/301* (2020.02); *C08F 222/104* (2020.02); *C08F 222/1065* (2020.02); *C08J 5/18* (2013.01); *C08J 7/042* (2013.01); *C08J 7/046* (2020.01); *H05K 5/03* (2013.01); *H10K 59/871* (2023.02); *B32B 2250/03* (2013.01); *B32B 2250/04* (2013.01); *B32B 2250/24* (2013.01); *B32B 2255/10* (2013.01); *B32B 2255/26* (2013.01); *B32B 2270/00* (2013.01); *B32B 2307/308* (2013.01); *B32B 2307/412* (2013.01); *B32B 2307/51* (2013.01); *B32B 2307/54* (2013.01); *B32B 2307/542* (2013.01); *B32B 2307/558* (2013.01); *B32B 2309/105* (2013.01); *B32B 2315/08* (2013.01); *B32B 2333/08* (2013.01); *B32B 2367/00* (2013.01); *B32B 2375/00* (2013.01); *B32B 2379/08* (2013.01); *B32B 2383/00* (2013.01); *B32B 2457/206* (2013.01); *B32B 2457/208* (2013.01); *C08J 2333/08* (2013.01); *H10K 2102/311* (2023.02)

(56) References Cited

U.S. PATENT DOCUMENTS

| | | | | |
|---|---|---|---|---|
| 2012/0069443 | A1 | 3/2012 | Taguchi et al. | |
| 2012/0165445 | A1* | 6/2012 | Lee | C08L 77/00 524/424 |
| 2016/0194448 | A1 | 7/2016 | Song et al. | |
| 2018/0258332 | A1* | 9/2018 | Song | C09J 183/04 |
| 2019/0023947 | A1* | 1/2019 | Sitter | B29D 11/00 |
| 2019/0315105 | A1* | 10/2019 | Isojima | G06F 1/1652 |
| 2020/0386917 | A1* | 12/2020 | Hashimoto | H10K 50/844 |

FOREIGN PATENT DOCUMENTS

| | | |
|---|---|---|
| JP | 2016-125063 | 7/2016 |
| JP | 2018159913 | 10/2018 |
| JP | 2019119084 | 7/2019 |
| WO | 2018/043627 | 3/2018 |
| WO | 2018/102179 | 6/2018 |
| WO | 2018128171 | 7/2018 |

* cited by examiner

FIG. 4A
S2a
S2b
S2
40
45
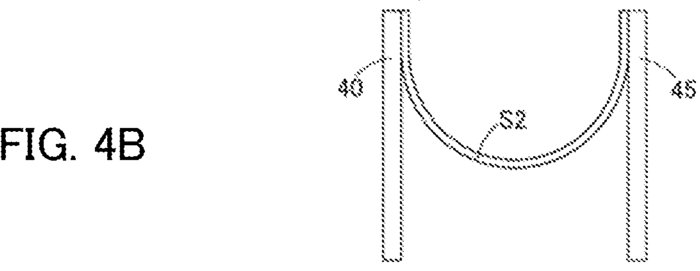
FIG. 4B
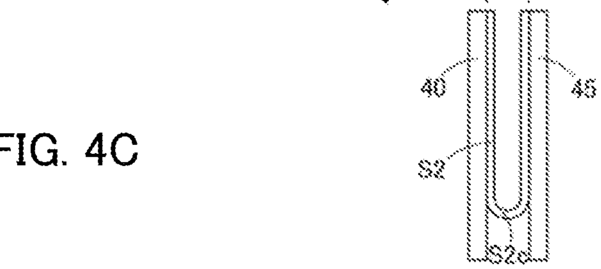
FIG. 4C

RESIN LAYER HAVING A SPECIFIC ELASTIC MODULUS, OPTICAL FILM, AND IMAGE DISPLAYING DEVICE

TECHNICAL FIELD

The present disclosure relates to a resin layer, an optical film, and an image displaying device.

BACKGROUND ART

An image displaying device such as a smartphone and a tablet terminal has been conventionally known. Currently, a foldable image displaying device has been developed. Smartphones, and tablet terminals, for example, are usually covered with a cover glass. Although, glass is generally excellent in hardness, it is difficult to bend so that, when a cover glass is used for an image displaying device, there is a high possibility that the glass will break if it is to be folded. For this reason, it has been considered to use a resin optical film formed of a resin for a foldable image displaying device, instead of a cover glass (see, for example, Patent Document 1).

CITATION LIST

Patent Document

Patent Document 1: Japanese Patent Application Laid-Open (JP-A) No. 2016-125063

SUMMARY OF DISCLOSURE

Technical Problem

In relation to the optical film used in such a foldable image displaying device, an impact may be applied to the surface of the optical film, so that impact resistance is required. Here, when an impact is applied to the surface of the optical film, the surface of the optical film may be recessed. Therefore, when an impact is applied to the surface of the optical film, an impact resistance so as to suppresses the concavity of the surface of the film, is currently required.

However, in the current optical film, an impact resistance so as to suppresses the concavity of the surface of the film, when an impact is applied to the surface of the optical film, is not provided.

Also, in relation to the image displaying device, the use under various environmental conditions should be considered. Specifically, for example, it is necessary to consider the use not only under room temperature (such as 23° C.) environment but also under low temperature (such as −40° C.) environment. For this reason, also for the optical film used in an image displaying device, not only the use under room temperature environment, but also the use under low temperature environment should be considered.

However, even in an optical film wherein a crack does not occur in the folding test under room temperature environment, when a folding test is carried out under low temperature environment, the flexibility is impaired so that a cack might occur.

The present disclosure has been made in view of the above circumstances. That is, an object of the present disclosure is to provide a resin layer having good impact resistance and having good folding property not only under room temperature environment but also under low temperature environment; and an optical film and an image displaying device provided with the same.

Solution to Problem

The present disclosure includes the following inventions.

[1] A resin layer used for an image displaying device, wherein a shear storage elastic modulus G' of the resin layer, at 25° C. and frequency range of 500 Hz or more and 1000 Hz or less, is 30 MPa or more and 200 MPa or less, and a glass transition temperature of the resin layer is 50° C. or more.

[2] The resin layer according to [1] above, wherein a thickness is 20 μm or more and 150 μm or less.

[3] An optical film with a foldable stacked structure, the optical film comprising at least the resin layer according to [1] or [2] above.

[4] The optical film according to [3] above, further comprising a functional layer provided on one surface side of the resin layer.

[5] The optical film according to [3] or [4] above, further comprising a resin substrate provided on one surface side of the resin layer.

[6] The optical film according to any one of [3] to [5] above, wherein a crack or a breakage does not occur in the optical film, when a test wherein the optical film is folded by 180° so as a distance between opposing side portions of the optical film is 10 mm, is repeatedly carried out for 100,000 times under 23° C. environment.

[7] The optical film according to [6] above, wherein a crack or a breakage does not occur in the optical film, when a test wherein the optical film is folded by 180° so as a distance between opposing side portions of the optical film is 10 mm, is repeatedly carried out for 100,000 times under −40° C. environment.

[8] An image displaying device comprising a displaying element; and the resin layer according to [1] or [2] above, or the optical film according to any one of [3] to [7] above, placed on an observer side than the displaying element.

[9] The image displaying device according to [8] above, wherein the displaying element is an organic light emitting diode element.

Advantageous Effects of Disclosure

The present disclosure is capable of providing a resin layer having good impact resistance and having good folding property not only under room temperature environment but also under low temperature environment; and an optical film and an image displaying device provided with the same.

BRIEF DESCRIPTION OF DRAWINGS

FIGS. 4A to 4C are views schematically illustrating how a consecutive folding test is carried out.

DESCRIPTION OF EMBODIMENTS

Figure 1:
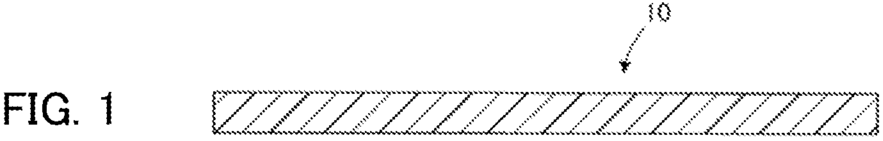
FIG. 1 is a schematic structural view of a resin layer according to an embodiment.
Figure 2:
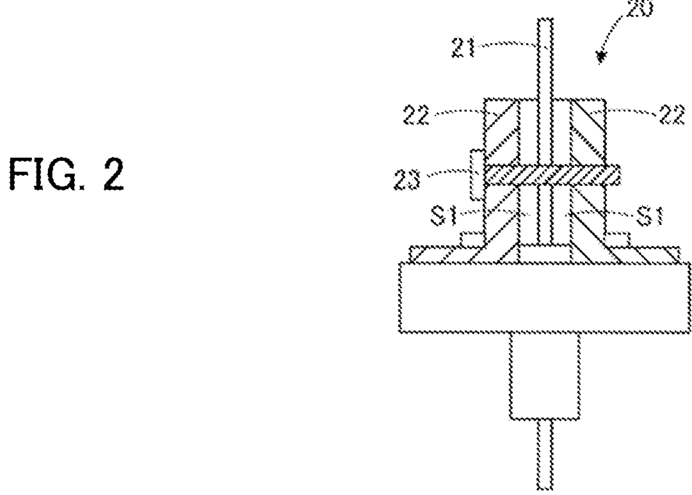
FIG. 2 is a schematic structural view of a solid shear jig used for measuring shear storage elastic modulus G' and glass transition temperature Tg.
Figure 3:
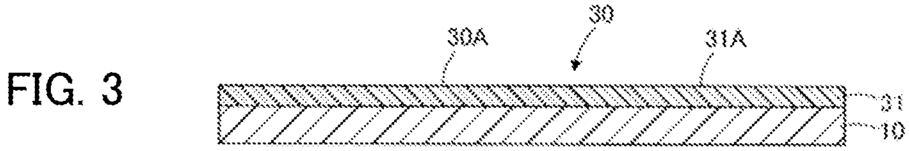
FIG. 3 is a schematic structural view of an optical film according to an embodiment.
Figure 5:
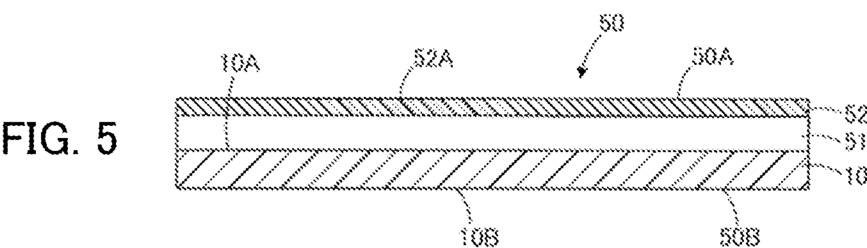
FIG. 5 is a schematic structural view of another optical film according to an embodiment.

Hereinafter, a resin layer, an optical film, and an image displaying device according to an embodiment of the present disclosure will be described by referring to the drawings. In the present specification, the terms "film", and "sheet", for example, are not distinguished from each other based only on differences in designations. Thus, for example, "film" is used in the sense that it also includes a member, also referred to as a sheet. FIG. 1 is a schematic structural view of a resin layer according to the present embodiment; FIG. 2 is a schematic structural view of a solid shear jig used for measuring shear storage elastic modulus G' and glass transition temperature Tg; FIG. 3 is a schematic structural view of an optical film according to the present embodiment; FIGS. 4A to 4C are views schematically illustrating how a consecutive folding test is carried out; and FIG. 5 is a schematic structural view of another optical film according to the present embodiment.

<<<Resin Layer>>>

Resin layer 10 illustrated in FIG. 1 is used for an image displaying device. A "resin layer" in the present specification is a layer of a single layer structure including a resin. The resin layer 10 includes a resin having a light transmissivity and is a layer having an impact absorbing property. The resin layer 10 may be used as a resin layer 10 alone, and may be used by being incorporated into optical film 30 wherein functional layer 31 described later is stacked on the resin layer 10, or optical film 50 provided with resin substrate 51 described later. Also, a releasing film may be adhered to the resin layer 10.

In the resin layer 10, the shear storage elastic modulus G' at 25° C. and frequency range of 500 Hz or more and 1000 Hz or less, is 30 MPa or more and 200 MPa or less. When the shear storage elastic modulus G' of the resin layer 10 is 30 MPa or more, it is possible to suppress the hardness decrease of the resin layer 10 as well as to suppress the deformation of the surface of the resin layer 10 when an impact is applied to the surface of the resin layer 10. Also, when the shear storage elastic modulus G' of the resin layer 10 is 200 MPa or less, the resin layer 10 is hardly cracked when folding the resin layer 10 at room temperature. The lower limit of the shear storage elastic modulus G' of the resin layer 10, is preferably 40 MPa or more, 50 MPa or more, or 80 MPa or more, from the viewpoint of suppressing the deformation of the surface of the resin layer 10 when an impact is applied to the surface of the resin layer 10, and also suppressing the hardness decrease of the resin layer 10. The upper limit of the shear storage elastic modulus G' of the resin layer 10 is preferably 190 MPa or less, 180 MPa or less, or 150 MPa or less.

The shear storage elastic modulus G' may be measured with a dynamic mechanical analyzing device (DMA). When the shear storage elastic modulus G' of the resin layer 10 is measured with the dynamic mechanical analyzing device (DMA), firstly, the resin layer 10 is punched into a rectangular shape of 10 mm×5 mm to obtain sample S1 (see FIG. 2). Then, two pieces of this sample S1 are prepared and installed into a solid shear jig which is an option of the dynamic mechanical analyzing device (such as trade name "Rheogel-E4000" from UBM Corporation). Specifically, as illustrated in FIG. 2, solid shear jig 20 is provided with one metal solid shear plate 21 (inner plate) having a thickness of 1 mm, and two L-shaped metal fittings 22 (outer plates) placed on both sides of this solid shear plate 21; one of the samples S is sandwiched between the solid shear plate 21 and one L-shaped metal fitting 22, and the other sample S1 is sandwiched between the solid shear plate 21 and the other L-shaped metal fitting 22. Then, the sample S1 is fixed by screwing between the L-shaped metal fittings 22 with screw 23. Then, after installing a tensile test chuck including an upper chuck and lower chuck into a dynamic mechanical analyzing device (trade name "Rheogel-E4000" from UBM Corporation), the solid shear jig is installed between the upper chuck and the lower chuck, at distance between chucks of 20 mm. The distance between chucks is a distance between the upper chuck and the lower chuck. Then, the temperature is set to 25° C., and the temperature is raised at 2° C./min. Under these conditions, the shear storage elastic modulus G' of the resin layer 10 is measured by applying longitudinal vibrations with a strain amount of 1% and frequency range of 500 Hz or more and 1000 Hz or less, to the two L-shaped metal fittings 22 while fixing the solid shear plate 21, thereby dynamic mechanical analysis of the solid at 25° C. is carried out. Here, the shear storage elastic modulus G' of the resin layer 10, at frequency range of 500 Hz or more and 1000 Hz or less is the value obtained as follows; the shear storage elastic modulus G' of the resin layer 10 is measured at respective frequency of 500 Hz, 750 Hz, and 950 Hz while applying longitudinal vibration of respective frequencies to the L-shaped metal fitting 22, to obtain the arithmetic average value of these shear storage elastic modulus G', further, this measurement is repeated for three times, and the shear storage elastic modulus G' is the arithmetic average value of the respectively obtained three arithmetic average values. Incidentally, the reason why the frequency range is set to 500 Hz or more and 1000 Hz or less in the above is that the frequency of this frequency range is the frequency wherein the surface of the resin layer 10 is deformed for several μm to several tens of μm, when an object is fallen freely from a height of several tens of cm.

The glass transition temperature Tg of the resin layer 10 is 50° C. or more. When the glass transition temperature Tg of the resin layer 10 is 50° C. or more, since the condition of the resin layer 10 is not changed even at room temperature (such as 23° C.) and low temperature (such as −40° C.), good folding property may be maintained. The lower limit of the glass transition temperature Tg of the resin layer 10 may be 53° C. or more, 55° C. or more, or 60° C. or more. Also, the upper limit of the glass transition temperature Tg of the resin layer 10 may be 90° C. or less, from the view point of securing the impact resistance.

The glass transition temperature Tg may be measured with a dynamic mechanical analyzing device (DMA). When the glass transition temperature Tg of the resin layer 10 is measured with the dynamic mechanical analyzing device (DMA), firstly, the resin layer 10 is punched into a rectangular shape of 10 mm×5 mm to obtain sample S1. Then, two pieces of this sample S1 are prepared and installed into a solid shear jig which is an option of the dynamic mechanical analyzing device (such as trade name "Rheogel-E4000" from UBM Corporation) as similar to the shear storage elastic modulus G'. Then, the temperature is set to −50° C., and the temperature is raised at 2° C./min. Under these conditions, the shear loss tangent tan δ (shear loss elastic modulus G"/shear storage elastic modulus G') of the resin layer 10 is measured by applying longitudinal vibrations with a strain amount of 1% and frequency range of 500 Hz or more and 1000 Hz or less, to the two L-shaped metal fittings 22 while fixing the solid shear plate, and carry out a dynamic mechanical analysis of the solid per 0.5° C. Then, the peak of the shear loss tangent tan δ is determined, and the temperature at which this peak is detected is regarded as glass transition temperature Tg. This measurement is repeated for three times, and the glass transition temperature Tg is the arithmetic average value of the respectively obtained three arithmetic average values.

Incidentally, even when the shear storage elastic modulus G' and glass transition temperature Tg of the optical film 30 wherein the functional layer 31 is stacked on the resin layer 10 are measured as described later, when the resin layer 10 is softer than the functional layer 31, the shear storage elastic modulus G' and glass transition temperature Tg of the optical film 30 may be regarded as the shear storage elastic modulus G' and glass transition temperature Tg of the resin layer 10. Whether or not the resin layer 10 is softer than the functional layer 31 is determined based on the displacement described later.

When another film such as a polarizing plate is provided on one surface of the resin layer 10 via a pressure-sensitive adhesive layer or an adhesive layer, the other film is peeled off together with the pressure-sensitive adhesive layer or the adhesive layer, and then, the shear storage elastic modulus G' or the glass transition temperature is measured. The peeling of another film may be carried out, for example, as follows. Firstly, a stacked body including another film adhered to the resin layer 10 via a pressure-sensitive adhesive layer or an adhesive layer is heated by a dryer, and the blade edge of a cutter is inserted into a portion which is considered to be an interface between the resin layer 10 and another film, and slowly peeled off. By repeating such heating and peeling, the pressure-sensitive adhesive layer or the adhesive layer and another film may be peeled off. Incidentally, even when there is such a peeling step, there is no significant influence on these measurements.

The thickness of the resin layer 10 is preferably 20 μm or more and 150 μm or less. When the thickness of the resin layer 10 is 20 μm or more, excellent impact resistance may be obtained, and when the thickness of the resin layer 10 is 150 μm or less, the resin layer 10 is not likely to be broken in 100,000 times of the consecutive folding tests, and exhibits excellent property. The lower limit of the thickness of the resin layer 10 is 40 μm or more, and more preferably 50 μm or more; and the upper limit of the thickness of the resin layer 10 is preferably 120 μm or less, 100 μm or less, 80 μm or less, or 60 μm or less, from the viewpoint of reducing the thickness, as well as good processability.

The thickness of the resin layer 10 is the arithmetic average value of the thickness of ten locations obtained by photographing the cross-section of the resin layer 10 using a scanning transmission type electron microscope (STEM), and measuring the thickness of the resin layer 10 in the image of the cross-section at 10 locations.

A specific method for photographing a cross-sectional photograph is described below. Firstly, a block wherein a resin layer cut out to a size of 1 mm×10 mm is embedded in an embedding resin is prepared, and a uniform section having a thickness of 70 nm or more and 100 nm or less without a hole, for example, is cut out from this block by a common section preparing method. For the preparation of the section, for example, an ultramicrotome EM UC7 from Leica Microsystems, Inc. may be used. This uniform section without a hole, for example, is used as a measurement sample. Thereafter, a cross-sectional photograph of the measurement sample is taken using a scanning transmission type electron microscope (STEM). Examples of the scanning transmission type electron microscope (STEM) may include 5-4800 from Hitachi High Technologies Corporation. When the cross-sectional photograph is taken using the S-4800, the cross-sectional observation is carried out by setting the detector to "TE", the acceleration voltage to "30 kV", and the emission current to "10 μA". Regarding magnification, the focus is adjusted, and the contrast and brightness are appropriately adjusted by a factor of 100 to 100,000, preferably by a factor of 1000 to 50,000, more preferably by a factor of 5,000 to 10,000 while observing whether each layer may be distinguished. Incidentally, when taking a cross-sectional photograph using the S-4800, the beam monitor aperture may further be set to "3", the objective lens aperture may be set to "3", also W.D. may be set to "8 mm". When measuring the thickness of the resin layer, it is important to observe the interface contrast between the resin layer and another layer (such as an embedding resin) as clearly as possible, when observing the cross-section. When this interface is difficult to observe due to lack of contrast, dyeing treatment such as osmium tetraoxide, ruthenium tetraoxide, and phosphotungsten acid may be carried out so that the interface between the organic layers becomes easier to see. Also, the interface contrast may be difficult to distinguish at higher magnification. In this case, a lower magnification observation is also carried out at the same time. For example, observation is carried out at two magnifications of high and low, such as by a factor of 2000 and 10,000, or by a factor of 5000 and 20,000, and the arithmetic average value described above is obtained at both magnifications, and the average value is regarded as the thickness of the resin layer.

The resin constituting the resin layer 10 is not particularly limited as long as the resin satisfies the shear storage elastic modulus G' and glass transition temperature Tg ranges described above. Examples of such a resin may include a cured product (polymerized product) of an ionizing radiation curable compound (ionizing radiation polymerizable compound). The ionizing radiation in the present specification may include visible light, ultraviolet rays, X-rays, electron beams, α-rays, β-rays, and γ-rays. Examples of the cured product of the ionizing radiation curable compound may include a urethane based resin or a silicone based resin.

(Urethane Based Resin)

The urethane based resin is a resin including a urethane bond. Examples of the urethane based resin may include a cured product of ionizing radiation curable urethane based resin composition and a cured product of thermosetting urethane based resin composition. Among them, the cured product of ionizing radiation curable urethane based resin composition is preferable from the viewpoint of obtaining a high hardness and the curing rate is high so as to be excellent in mass productivity.

The ionizing radiation curable urethane based resin composition comprises urethane (meth) acrylate, and the thermosetting urethane based resin composition comprises a polyol compound and an isocyanate compound. The urethane (meth) acrylate, the polyol compound, and the isocyanate compound may be any one of monomers, oligomers, and prepolymers.

The number of (meth) acryloyl groups (number of functional groups) in the urethane (meth) acrylate is preferably 2 or more and 4 or less. When the number of (meth) acryloyl groups in the urethane (meth) acrylate is less than 2, the pencil hardness may be low, and when more than 4, the curing shrinkage may be large, the resin layer may be curled, and cracks may occur in the resin layer at the time of folding. The upper limit of the number of (meth) acryloyl groups in the urethane (meth) acrylate is preferably 3 or less. Incidentally, "(meth) acrylate" is meant to include both "acrylate"

and "methacrylate", and "(meth) acryloyl group" is meant to include both "acryloyl group" and "methacryloyl group".

The weight average molecular weight of the urethane (meth) acrylate is preferably 1500 or more and 20000 or less. When the weight average molecular weight of the urethane (meth) acrylate is less than 1500, the impact resistance may be lowered, and when more than 20000, the viscosity of the ionizing radiation curable urethane based resin composition is increased so that the coatability may be deteriorated. The lower limit of the weight average molecular weight of the urethane (meth) acrylate is preferably 2000 or more, and the upper limit is preferably 15000 or less.

Also, examples of the repeating unit having a structure derived from the urethane (meth) acrylate may include structures represented by the following general formulas (1), (2), (3) or (4), for example.

[Chemical 1]

(1)

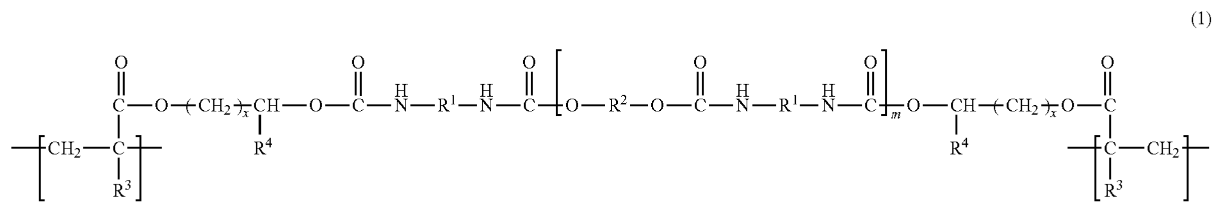

In the general formula (1), $R^1$ represents a branched chain alkyl group; $R^2$ represents a branched chain alkyl group or a saturated cyclic aliphatic group; $R^3$ represents a hydrogen atom or a methyl group; $R^4$ represents a hydrogen atom, a methyl group or an ethyl group; "m" represents an integer of 0 or more; and "x" represents an integer of 0 to 3.

[Chemical 2]

(2)

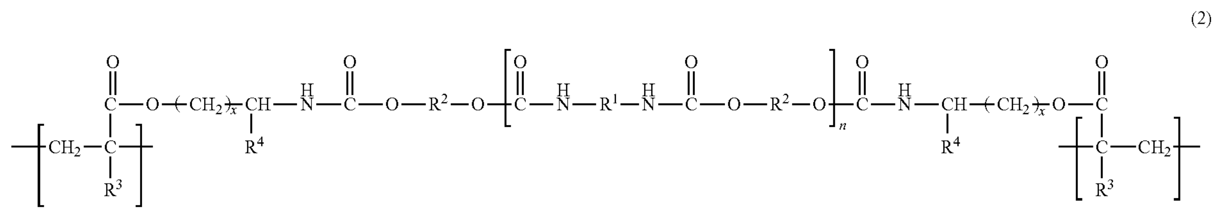

In the general formula (2), $R^1$ represents a branched chain alkyl group; $R^2$ represents a branched chain alkyl group or a saturated cyclic aliphatic group; $R^3$ represents a hydrogen atom or a methyl group; $R^4$ represents a hydrogen atom, a methyl group or an ethyl group; "n" represents an integer of 1 or more; and "x" represents an integer of 0 to 3.

[Chemical 3]

(3)

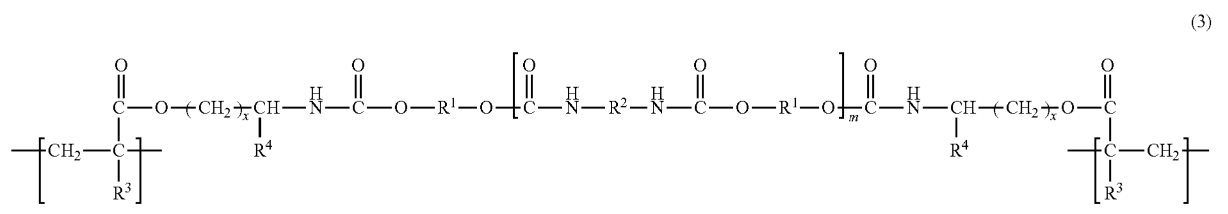

In the general formula (3), $R^1$ represents a branched chain alkyl group; $R^2$ represents a branched chain alkyl group or a saturated cyclic aliphatic group; $R^3$ represents a hydrogen atom or a methyl group; $R^4$ represents a hydrogen atom, a methyl group or an ethyl group; "m" represents an integer of 0 or more; and "x" represents an integer of 0 to 3.

[Chemical 4]

(4)

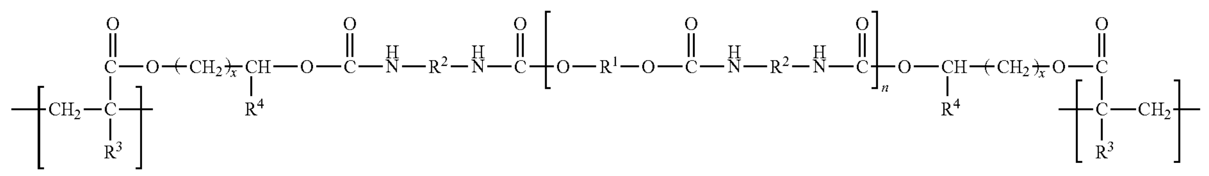

In the general formula (4), $R^1$ represents a branched chain alkyl group; $R^2$ represents a branched chain alkyl group or a saturated cyclic aliphatic group; $R^3$ represents a hydrogen atom or a methyl group; $R^4$ represents a hydrogen atom, a methyl group or an ethyl group; "n" represents an integer of 1 or more; and "x" represents an integer of 0 to 3.

Incidentally, which structural of polymer chains (repeating units) is the resin included in the resin layer 10 formed by may be determined by analyzing the resin layer 10 by, for example, pyrolysis gas chromatography mass spectrometry (GC-MS) and Fourier transform infrared spectroscopy (FT-IR). In particular, a pyrolysis GC-MS is useful since it may detect monomeric units included in the resin layer 10 as monomeric components.

The resin layer 10 may include, for example, an ultraviolet absorber, a spectroscopic transmittance modifier, an antifouling agent, inorganic particles, and/or an organic particle, besides the resin.

<<<Optical Film>>>

Optical film 30 illustrated in FIG. 3 is a film having a stacked structure, and includes at least resin layer 10. The optical film 30 includes the resin layer 10 and functional layer 31 provided on one surface of the resin layer 10. As used herein, "functional layer" is a layer that exhibits some sort of function. The functional layer 31 has a single-layer structure, and may have a multi-layer structure of two or more layers.

In the optical film 30, the shear storage elastic modulus G' at 25° C. and the frequency range of 500 Hz or more and 1000 Hz or less is 30 MPa or more and 200 MPa or less. When the shear storage elastic modulus G' of the optical film 30 is 30 MPa or more, it is possible to suppress the hardness reduction of the optical film 30 while suppressing the deformation of the surface 30A of the optical film 30 when an impact is applied to the surface 30A of the optical film 30. Also, when the shear storage elastic modulus G' of the optical film 30 is 200 MPa or less, the optical film 30 is less likely to be cracked when folded at room temperature. The lower limit of the shear storage elastic modulus G' of the optical film 30 is preferably 40 MPa or more, 50 MPa or more, and 80 MPa or more, from the viewpoint of further suppressing the deformation of the surface 30A of the optical film 30 when an impact is applied to the surface of the optical film 30, and also further suppressing the hardness reduction of the optical film 30. The upper limit of the shear storage elastic modulus G' of the optical film 30 is preferably 190 MPa or less, 180 MPa or less, and 170 MPa or less, from the viewpoint of further suppressing cracking during folding. The shear storage elastic modulus G' of the optical film 30 is measured in the same manner as the measurement of the shear storage elastic modulus G' of the resin layer 10.

The optical film 30 is foldable. Specifically, it is preferable that a crack or a breakage does not occur in the optical film 30, even when a folding test (consecutive folding test) described below is repeatedly carried out for 100,000 times, 200,000 times, 500,000 times, or 1,000,000 times to the optical film 30 under an environment of a temperature of 23±5° C. (such as a temperature of 23° C.) and a relative humidity of 30% or more and 70% or less, and under an environment of a temperature of −40° C.±5° C. (such a temperature of −40° C.), respectively. When the consecutive folding test is repeated for 100,000 times to the optical film 30, if a crack or a breakage, for example, occurs in the optical film 30, the folding property of the optical film 30 is not sufficient. Incidentally, the reason why the number of foldings in the consecutive folding test is at least 100,000 times, in the evaluation, is as follows. For example, assuming that an optical film is incorporated into a foldable smart phone, the frequency of folding (frequency of opening and closing) is very high. For this reason, in the evaluation wherein the number of foldings in the consecutive folding test is set to, for example, 10,000 times or 50,000 times, there is a fear that evaluation at a practical level may not be carried out. Specifically, for example, assuming a person who always uses a smartphone, it is assumed that the smartphone is opened and closed 5 to 10 times even during commuting on, for example, a train or a bus in the morning. Therefore, it is assumed that the smartphone is opened and closed at least 30 times even in one day alone. Therefore, assuming that the smartphone is opened and closed for 30 times a day, since 30 times×365 days=10,950 times, the consecutive folding test by 10,000 foldings is a test that assumes a one-year use. That is, even when the result of the consecutive folding test by 10000 foldings is good, there is a possibility that a crack or a breakage will occur in the optical film after 1 year has passed. Therefore, the evaluation by 10,000 foldings in the consecutive folding test can only confirm a level which may not be used as a product. Therefore, sufficient evaluation is not possible since a product which may be used but is not sufficient is evaluated as satisfactory. For this reason, in order to evaluate whether it is a practical level or not, a product must be evaluated by at least 100,000 times of foldings in the consecutive folding test. The consecutive folding test may be carried out to fold the optical film 30 so that the surface 30A is on the outside, or to fold the optical film 30 so that the surface 30A is on the inside, and in any event, a crack or a breakage does not preferably occur in the optical film 30.

The consecutive folding test is carried out as follows. As illustrated in FIG. 4A, in the consecutive folding test, firstly, sample S2 having a size of 30 mm×100 mm is cut out from the optical film 30. Incidentally, when the sample S2 having a size of 30 mm×100 mm cannot be cut out from the optical film 30, the sample S2 may be cut out to a size of, for example, 10 mm×100 mm. Then, the side portion S2*a* of the cut-out sample S2, and the side portion S2*b* opposing the side portion S2*a* are respectively fixed with fixing portions 40 and 45 of a parallelly arranged folding resistance tester (such as product name "U-shaped folding tester DLDMLH-FS", IEC62715-6-1 compliant from Yuasa System Co., Ltd.). The fixing by the fixing portions 40 and 45 is carried out by holding a portion of the sample S2 of approximately 10 mm on one side in the longitudinal direction of the sample S2. However, in the case where the sample S2 is smaller than the size described above, when the portion of the sample S2 required for this fixing is up to approximately 20 mm, the measurement may be carried out by adhering thereof to the fixing portions 40 and 45 with tape. As illustrated in FIG. 4A, the fixing portion 40 is slidable in the horizontal direction. Incidentally, unlike the conventional method wherein a sample is wound around a rod, the device described above is preferable because it may evaluate the endurance to the folding load without causing tension or friction in the sample.

Next, as illustrated in FIG. 4B, by moving the fixing portion 40 so as to be close to the fixing portion 45, the center portion of the sample S2 is deformed so as to be folded, and further, as illustrated in FIG. 4C, after moving the fixing portion 40 to a position where the interval φ of the two opposing side portions S2*a* and S2*b* fixed with the fixing portions 40 and 45 of the sample S2 is 10 mm, the fixed portion 40 is moved in the opposite direction to dissolve the deformation of the optical film 30.

By moving the fixing portion 40 as illustrated in FIGS. 4A to 4C, the center portion of the sample S2 may be folded by 180°. Also, by preventing the bent portion S2*c* of the sample S2 from protruding from the lower ends of the fixing portions 40 and 45; and by carrying out the consecutive folding test under the following conditions; and also by controlling the interval φ when the fixing portions 40 and 45 are closest to each other, the interval φ between the two opposing side portions S2*a* and S2*b* of the sample S2 may be adjusted to 10 mm. In this case, the outer diameter of the bent portion S2*c* is regarded to be 10 mm. In the sample S2, it is preferable that a crack or a breakage does not occur when a folding test by 180° so as the interval φ between the opposing side portions of the sample S2 is 10 mm, is repeatedly carried out for 100,000 times, and it is further preferable that a crack or a breakage does not occur when a consecutive folding test folding by 180° so as the interval φ between the opposing side portions S2*b* and S2*c* of the sample S2 is 8 mm or 6 mm, is repeatedly carried out for 100,000 times.

(Folding Conditions)

Reciprocating speed: 120 rpm (per minute)

Bending angle: 180°

The surface 30A of the optical film 30 (the surface 31A of the functional layer 31) preferably has a hardness (pencil hardness) of 2H or more, more preferably 3H or more, when measured by the pencil hardness test defined in JIS K5600-5-4: 1999. The pencil hardness test shall be carried out by fixing the optical film 30 cut to a size of 30 mm×100 mm with cello tape (registered trademark) from Nichiban Corporation so that there is no breakage or wrinkles on the glass plate, and using a pencil hardness tester (such as product name "Pencil scratch coating film hardness tester (electric type)", from Toyo Seiki Co., Ltd.) to the surface 30A of the optical film 30 under environment of a temperature of 23±5° C. and a relative humidity of 30% or more and 70% or less, by moving the pencil (for example, product name "Uni", from Mitsubishi Pencil Corporation) at a moving speed of 1 mm/sec while applying a load of 750 g to the pencil. The pencil hardness shall be the highest hardness at which the optical film surface was not bruised in the pencil hardness test. Incidentally, when measuring the pencil hardness, a plurality of pencils with different hardness are used. However, when the pencil hardness test is carried out for five times per pencil and the surface of the optical film is not bruised in 4 tests or more out of 5 tests, it is determined that the surface of the optical film is not bruised with this pencil hardness. The bruise refers to a bruise that is visually observed by transmitting through the surface of the optical film subjected to the pencil hardness test, under a fluorescent lamp.

When another film such as a polarizing plate is provided on one surface of the optical film 30 via a pressure-sensitive adhesive layer or an adhesive layer, another film is peeled off together with the pressure-sensitive adhesive layer or the adhesive layer, and then the shear storage elastic modulus G' and glass transition temperature are measured and the folding test is carried out, in the same manner as described above.

The optical film 30 may be cut to a desired size, and may be roll-shaped. When the optical film 30 is cut to a desired size, the size of the optical film is not particularly limited, and it is appropriately determined according to the size of the display surface of an image displaying device. Specifically, the size of the optical film 30 may be, for example, 2.8 inches or more and 500 inches or less. "Inch" in the present specification means the length of the diagonal line when the optical film is rectangle, means the diameter when it is circular, and means an average value of the sum of the minor and major diameters when it is elliptical. When the optical film is rectangle, the aspect ratio of the optical film when determining the inches is not particularly limited as long as there is no problem as the display screen of an image displaying device. Examples thereof may include vertical: horizontal=1:1, 4:3, 16:10, 16:9, and 2:1. However, in vehicle-mounted applications and digital signage rich in design, particularly, the aspect ratio is not limited to such aspect ratio. Also, when the size of the optical film 30 is large, the A5 size (148 mm×210 mm) is cut out from an arbitrary position, and then, the A5 size is cut out to the size of the respective measured items. Incidentally, for example, when the optical film 30 is in the form of a roll, a predetermined length is unrolled from the roll of the optical film 30, and the desired size is cut out from the effective region in the vicinity of the center portion wherein the quality is stable, rather than the non-effective region including both end portions extending along the longitudinal direction of the roll.

Applications of the optical film 30 are not particularly limited, and examples of the applications of the optical film 30 may include an image displaying device of, for example, smartphones, tablet terminals, personal computers (PCs), wearable terminals, digital signage, television, and car navigation. The optical film 30 is also suitable for in-vehicle applications. As for the aspects of the respective image displaying devices, applications requiring flexibility such as foldable and rollable is also preferable.

The providing location of the optical film 30 in the image displaying device may be inside of the image displaying device, and it is preferably near the surface of the image displaying device. When used near the surface of the image displaying device, the optical film 30 functions as a cover film (window film) used in place of a cover glass.

<<Functional Layer>>

The functional layer 31 illustrated in FIG. 3 is a layer that functions as a hard coating layer. However, the functional layer 31 may be a layer having other functions. The "hard coating layer" in the present specification means a layer having a pencil hardness of "H" or more in the pencil hardness test described above.

When the displacement of the functional layer 31 is measured by a nanoindentation method, the displacement of the functional layer 31 is preferably 50 nm or more and 500 nm or less. When the displacement of the functional layer 31 is 50 nm or more, a good hardness may be obtained, and when the displacement is 500 nm or less, a good folding property may be obtained. The measurement of the displacement by the nanoindentation method may be carried out using a "TI950 TriboIndenter" from Brucker, to the optical film cut out to a size of 30 mm×30 mm. Specifically, under the following measuring conditions, the depth when a Berkovich indenter (a triangular pyramid, for example, a TI-0039 from Bruker Corporation) as the indenter is compressed perpendicularly onto the cross-section of the functional layer under 500 μN, is measured, and the measured depth is regarded as the displacement. Here, in order to avoid an influence of the resin layer and the side edge of the functional layer, the Berkovich indenter shall be compressed into a portion of the functional layer which is 500 nm or more away from the interface between the resin layer and the functional layer toward the center of the functional layer, and 500 nm or more away from both side edges of the functional layer respectively toward the center of the functional layer. The displacement may be adjusted by the type of the resin, and the content of inorganic particles, for example, to be described later.

(Measurement Conditions)

Controlling method: Load control (maximum load of 500 μN)
Lift: 0 nm
Preload: 0.5 μN
Loading speed: 20 μN/second
Retention time: 5 seconds
Unloading speed: 20 μN/second
Measuring temperature: 23±5° C.
Relative humidity: 30% to 70%

The thickness of the functional layer 31 is preferably 3 μm or more and 10 μm or less. When the thickness of the functional layer 31 is 3 μm or more, good hardness may be obtained, and when it is 10 μm or less, deterioration of workability may be suppressed. In the present specification, the term "thickness of a functional layer" means a thickness (total thickness) obtained by summing the thicknesses of the respective functional layers when the functional layer has a multilayered structure. The lower limit of the thickness of the functional layer 31 is more preferably 5 μm or more, and the upper limit is more preferably 8 μm or less. The thickness of the functional layer 31 may be measured in the same manner as the thickness of the resin layer 10.

It is preferable that the functional layer 31 further includes a resin and an inorganic particle dispersed in the resin.

<Resin>

The resin includes a polymer (cured product) of aa polymerizable compound (curable compound). The polymerizable compound is one including at least one polymerizable functional group in the molecule. Examples of the polymerizable functional group may include ethylenically unsaturated groups such as a (meth) acryloyl group, a vinyl group, and an allyl group.

As the polymerizable compound, polyfunctional (meth) acrylate is preferable. Examples of the polyfunctional (meth)acrylate may include trimethylolpropane tri (meth) acrylate, tripropylene glycol di(meth)acrylate, diethylene glycol di(meth)acrylate, dipropylene glycol di(meth)acrylate, pentaerythritol tri(meth)acrylate, pentaerythritol tetra (meth)acrylate, dipentaerythritol hexa(meth)acrylate, 1,6-hexanediol di(meth)acrylate, neopentyl glycol di(meth) acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, tri(meth)acrylate isocyanurate, di(meth)acrylate isocyanurate, polyester tri (meth)acrylate, polyester di(meth)acrylate, bisphenol di(meth)acrylate, diglycerine tetra(meth)acrylate, adamantly di(meth)acrylate, isoboronyl di(meth)acrylate, dicyclopentane di(meth)acrylate, tricyclodecane di(meth)acrylate, ditrimethylolpropane tetra(meth)acrylate, and modifications of these with PO, EO, or caprolactone, for example.

Among these, since the displacement described above may be preferably satisfied, those including 3 to 6 functional groups are preferable, and for example, pentaerythritol triacrylate (PETA), dipentaerythritol hexaacrylate (DPHA), pentaerythritol tetraacrylate (PETTA), dipentaerythritol pentaacrylate (DPPA), trimethylolpropane tri (meth) acrylate, tripentaerythritol octa (meth) acrylate, tetrapentaerythritol deca (meth) acrylate are preferable.

Incidentally, in order to improve the hardness, the viscosity adjustment of the composition, and the adhesion, for example, a monofunctional (meth) acrylate monomer may be further included. Examples of the monofunctional (meth) acrylate monomer may include hydroxyethyl acrylate (HEA), glycidyl methacrylate, methoxypolyethylene glycol (meth) acrylate, isostearyl (meth) acrylate, 2-acryloyloxyethyl succinate, acryloylmorpholine, N-acryloyloxyethylhexahydrophthalimide, cyclohexyl acrylate, tetrahydrofuryl acrylate, isobornyl acrylate, phenoxyethyl acrylate, and adamantyl acrylate.

The weight average molecular weight of the monomer is preferably less than 1000, more preferably 200 or more and 800 or less, from the viewpoint of improving the hardness of the resin layer. Also, the weight average molecular weight of the polymerizable oligomer is preferably 1000 or more and 20000 or less, more preferably 1000 or more and 10000 or less, and still more preferably 2000 or more and 7000 or less.

<Inorganic Particle>

The inorganic particle is not particularly limited as long as the hardness may be improved, and a silica particle is preferable from the viewpoint of obtaining excellent hardness. Among the silica particle, a reactive silica particle is preferable. The reactive silica particle is a silica particle capable of constituting a crosslinked structure with the polyfunctional (meth) acrylate. By including this reactive silica particle, the hardness of the functional layer 31 may be sufficiently increased.

The reactive silica particle preferably includes a reactive functional group on the surface thereof, and as the reactive functional group, for example, polymerizable functional group described above is suitably used.

The reactive silica particle is not particularly limited, and conventionally known ones may be used, and examples thereof may include reactive silica particles described in Japanese Patent Application Laid-Open No. 2008-165040. Also, examples of commercially available products of the reactive silica particle may include MIBK-SD, MIBK-SD-MS, MIBK-SD-L, MIBK-SD-ZL (all from Nissan Chemical Industry Co., Ltd.), and V8802 and V8803 (all from JGC Catalysts and Chemicals Ltd.).

Also, although the silica particle may be a spherical silica particle, the silica particle is preferably a deformed silica particle. The spherical silica particle and the deformed silica particle may be mixed. In the present specification, the term "spherical silica particle" means, a silica particle of true sphere shape, and ellipsoidal sphere shape, for example, and the term "deformed silica particle" means a silica particle of a shape having random irregularities of potato-like shape (the aspect ratio at the time of cross-sectional observation is 1.2 or more and 40 or less) on the surface. Since the deformed silica particle has a larger surface area compared with the spherical silica particle, by including such deformed silica particle, the contact area with the polyfunctional (meth) acrylate, for example, becomes large, so that the hardness of the functional layer 31 may be improved. Whether or not the silica particle included in the functional layer 31 is the deformed silica particle, or not may be confirmed by observing the cross-section of the functional layer 31 with a transmission electron microscope (TEM) or a scanning transmission type electron microscope (STEM).

Average particle size of the silica particle is preferably 5 nm or more and 200 nm or less. When the average particle size of the silica particle is 5 nm or more, the production of the particle itself is not difficult, aggregation of the particles may be suppressed, and it is not difficult to make them deformed. Meanwhile, when the average particle size of the deformed silica particle is 200 nm or less, large irregularities may be suppressed from being formed on the functional layer, and also, an increase in haze may be suppressed. When the silica particle is the spherical silica particle, the arithmetic average value of the particle size of 20 particles obtained by measuring the particle size of 20 particles from a cross-sectional image of the particles photographed using a transmission electron microscope (TEM) or a scanning transmission type electron microscope (STEM), is regarded as the average particle size of the silica particle. Also, when the silica particle is the deformed silica particle, the arithmetic average value of the particle size of 20 particles obtained by measuring the maximum value (major axis) and the minimum value (minor axis) of the distances between two points of the outer periphery of the particle from a cross-sectional image of the functional layer photographed using a transmission electron microscope (TEM) or a scanning transmission type electron microscope (STEM), and by averaging the particle size, is regarded as the average particle size of the silica particle.

The hardness (displacement) of the functional layer 31 may be controlled by controlling the size and the mixing amount of the inorganic particle. For example, when forming the functional layer 31, the diameter of the silica particle is preferably 5 nm or more and 200 nm or less, and the content thereof is preferably 25 to 60 parts by mass with respect to 100 parts by mass of the polymerizable compound.

The functional layer 31 may include a material other than the materials described above within a range satisfying the displacement described above, and may include, for example, a polymerizable monomer, and a polymerizable oligomer which forms a cured product by irradiation with ionizing radiation as a material of a resin component. Examples of the polymerizable monomer and polymerizable oligomer may include a (meth) acrylate monomer including a radically polymerizable unsaturated group in a molecule, and a (meth) acrylate oligomer including a radically polymerizable unsaturated group in a molecule. Examples of the (meth)acrylate monomer including a radically polymerizable unsaturated group in a molecule, or the (meth)acrylate oligomer including a radically polymerizable unsaturated group in a molecule may include monomers or oligomers such as urethane (meth)acrylate, polyester (meth)acrylate, epoxy (meth)acrylate, melamine (meth)acrylate, polyfluoroalkyl (meth)acrylate, and silicone (meth)acrylate. These polymerizable monomers or polymerizable oligomers may be used in combination of 1 kind or 2 kinds or more. Among them, urethane (meth) acrylates of a polyfunctional (6 or more functional) and a weight average molecular weight of 1000 to 10000 are preferable.

The functional layer 31 may further include an ultraviolet absorber, a spectroscopic transmittance modifier, and/or an antifouling agent.

<<<Other Optical Film>>>

The optical film 30 illustrated in FIG. 3 does not include a substrate. However, it may be provided with a substrate, such as the optical film 50 illustrated in FIG. 5. As illustrated in FIG. 5, the optical film 50 includes resin layer 10, resin substrate 51, and functional layer 52 in this order. The resin substrate 51 may be adjacent to the resin layer 10. Incidentally, in the optical film 50, the resin layer 10 is adjacent to the resin substrate 51, and may be adhered to the resin substrate via a pressure-sensitive adhesive layer.

The surface 50A of the optical film 50 is the surface 52A of the functional layer 52. Since the surface of the optical film is used herein to mean one surface of the optical film, the surface opposite to the surface of the optical film is referred to as the back surface in order to distinguish it from the surface of the optical film. The back surface 50B of the optical film 50 is a surface of the resin layer 10, opposite side to the surface of the resin substrate 51 side.

The optical film 50 is foldable under respective environment of a temperature of 23±5° C. and a relative humidity of 30% or more and 70% or less, and under environment of a temperature of −40° C. The preferable number of foldings, the preferable distance φ between opposing side portions, and the conditions of the consecutive folding test are the same as those for the optical film 30, and the explanation thereof is omitted here.

The surface 50A of the optical film 50 (the surface 52A of the functional layer 52) preferably has a hardness (pencil hardness) of 2H or more, more preferably 3H or more, as measured by the pencil hardness test specified in JIS K5600-5-4: 1999. The pencil hardness of the optical film 50 is measured in the same manner as the pencil hardness of the optical film 30.

The optical film 50 preferably has a yellow index (YI) of 15 or less. When the YI of the optical film 50 is 15 or less, the yellowness of the optical film may be suppressed, and it may be applied to an application requiring transparency. The upper limit of the yellow index (YI) of the optical film 50 is more preferably 10 or less, 5 or less, or 1.5 or less. The yellow index (YI) is a value obtained by calculating the chromaticity tristimulus values X, Y, and Z according to the calculation formula described in JIS Z8722:2009 from the transmittance of an optical film at wavelengths of 300 nm to 780 nm measured under a state wherein, under an environment of a temperature of 23±5° C. and a relative humidity of 30% or more and 70% or less, the optical film cut out to a size of 50 mm×100 mm is placed in a spectrophotometer (such product name "UV-2450", from Shimadzu Corporation, light source: tungsten lamp, and deuterium lamp) so that the resin layer side thereof is facing the light source side, and then, calculating the value from the tristimulus values X, Y, and Z according to the calculation formula described in ASTM D1925: 1962. The upper limit of the yellow index YI of the optical film 50 is more preferably 10 or less. The yellow index (YI) is arithmetic average value of the values obtained by measuring three times for one optical film. Incidentally, in UV-2450, the yellow index is calculated by reading the measurement data of the transmittance on the monitor connected to UV-2450, and checking the item "YI" in the calculation item. The measurement of the transmittance at wavelengths from 300 nm to 780 nm is obtained by measuring the transmittance in at least 5 points within 1 nm back and forth respectively at wavelengths from 300 nm to 780 nm under the following conditions, and calculating an average. Also, when the spectrum of the spectroscopic transmittance is undulated, the smoothing treatment may be carried out at delta of 5.0 nm.

(Measurement Conditions)

Wavelength range: 300 nm to 780 nm
Scan Speed: high speed
Slit width: 2.0
Sampling interval: auto (0.5 nm interval)
Lighting: C
Light source: D2 and WI
Field of view: 2°
Light source switching wavelength: 360 nm
S/R switching: standard
Detector: PM
Auto zero: carried out at 550 nm after baseline scanning The total light transmittance of the optical film 50 is preferably 85% or more. When the total light transmittance of the optical film 50 is 85% or more, sufficient image visibility may be obtained when the optical film 50 is used for a mobile terminal. The total light transmittance of the optical film 50 is preferably 87% or more, or 90% or more.

The total light transmittance may be measured by a method according to JIS K7361-1: 1997 using a haze meter (for example, the product name "HM-150", from Murakami Color Research Laboratory Co., Ltd.) under an environment of a temperature of 23±5° C. and a relative humidity of 30% or more and 70% or less. The total light transmittance is the arithmetic average value of the values obtained by measuring for three times as follows; after cutting out the optical film to a size of 50 mm×100 mm, it is placed without curling or wrinkles, and without fingerprints or dust, for example, and measure three times for one optical film. As used herein, "three measurements" is intended to mean measurements of three difference locations, rather than three measurements of the same location. In the optical film 50, the visually observed surface 50A is flat, and the layer to be stacked such as the resin layer 10 is also flat, and the thickness variation is within ±10% range. Therefore, it is considered that the average of the total light transmittance of the approximate whole plane of the optical film may be obtained by measuring the total light transmittance at three different locations in the cut-out optical film. The variation of the total light transmittance is within ±10% even when the object to be measured is lengthy as 1 m×3000 m, or even when it is a 5-inch size such as a size of a smartphone. Incidentally, when the optical film cannot be cut out to the above size, since the inlet opening for measuring of HM-150, for example, is 20 mmφ, the sample size such that the diameter is 21 mm or more is required. Therefore, the optical film may be appropriately cut to a size of 22 mm×22 mm or more. When the optical film size is small, three locations are measured by shifting the sample little by little to the extent that the light source spot does not deviate, or changing the angle.

The haze value of the optical film 50 is preferably 2.0% or less. When the haze value of the optical film 50 is 2.0% or less, the whitening of the image display surface may be suppressed, when the optical film 50 is used for a mobile terminal. The haze value is more preferably 1.5% or less, 1.0% or less, or 0.5% or less.

The haze values may be measured by a method according to JIS K7136:2000 using a haze meter (for example, product name "HM-150", from Murakami Color Research Laboratory Co., Ltd.) under an environment of a temperature of 23±5° C. and a relative humidity of 30% or more and 70% or less. Specifically, the haze value is measured by the same method as the method for measuring a total light transmittance.

When another film such as a polarizing plate is provided on the front surface 50A side or the back surface 50B side of the optical film 50 via a pressure-sensitive adhesive layer or an adhesive layer, another film is peeled off together with the pressure-sensitive adhesive layer or the adhesive layer, and then, a folding test, a yellow index measurement, a total light transmittance measurement, and a haze value measurement, for example, are carried out. Incidentally, even when there is such a peeling step, there is no significant influence on these tests and these measurements. The measurement of the haze is carried out after peeling off the pressure-sensitive adhesive layer or the adhesive layer and further, after wiping off the grime of the pressure-sensitive adhesive layer or the adhesive layer thoroughly with alcohol.

The application of the optical film 50 is not particularly limited, and examples thereof may include the same application as that described in the column of the optical film 30.

<<Resin Substrate>>

The resin substrate 51 has light transmissivity. The "light transmissivity" in the present specification refers to a property of transmitting light includes those having the total light transmittance of, for example, 50% or more, preferably 70% or more, more preferably 80% or more, and particularly preferably 90% or more. To have the light transmittivity, it is not necessary be transparent, and may be translucent.

The resin substrate 51 preferably includes one kind or more resin selected from the group consisting of, for example, a polyimide based resin, a polyamide imide based resin, a polyamide based resin, and a polyester based resin (such as a polyethylene terephthalate resin, and a polyethylene naphthalate resin).

Among these resins, the polyimide based resin, the polyamide based resin, or a mixture thereof is preferable from the viewpoint of, not only a crack or a breakage is less likely occur in the consecutive folding test, but also having good hardness and transparency, and also excellent in heat resistance, and capable of imparting further superior hardness and transparency by burning thereof.

The polyimide based resin is obtained by reacting a tetracarboxylic acid component and a diamine component. The polyimide based resin is not particularly limited. From the viewpoint of having good light transmissivity and stiffness, for example, it is preferable to have at least one kind of the structure selected from the group consisting of the structure represented by the following general formula (5) and the following general formula (7).

[Chemical 5]

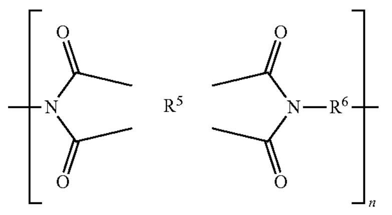

(5)

In the general formula (5), $R^5$ represents a tetravalent group which is a tetracarboxylic acid residue, $R^6$ represents at least one kind of divalent group selected from the group consisting of a trans-cyclohexanediamine residue, a trans-1,4-bismethylenecyclohexanediamine residue, a 4,4'-diaminodiphenylsulfone residue, a 3,4'-diaminodiphenylsulfone residue, and a divalent group represented by the following general formula (6). The "n" represents the number of repeating units, and is 1 or more. The "tetracarboxylic acid residue" in the present specification refers to a residue obtained by excluding four carboxyl groups from a tetracarboxylic acid; and represents the same structure as a residue obtained by excluding an acid dianhydride structure from a tetracarboxylic acid dianhydride. Also, "diamine residue" refers to a residue obtained by excluding two amino groups from a diamine.

[Chemical 6]

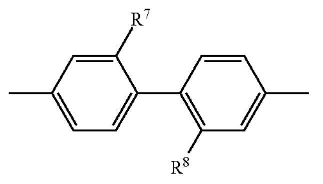

(6)

In the general formula (6), $R^7$ and $R^8$ each independently represent a hydrogen atom, an alkyl group, or a perfluoroalkyl group.

[Chemical 7]

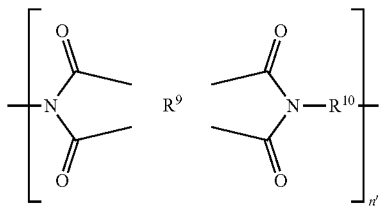

(7)

In the general formula (7), $R^9$ represents at least one kind of tetravalent group selected from the group consisting of a cyclohexane tetracarboxylic acid residue, a cyclopentanetetracarboxylic acid residue, a dicyclohexane-3,4,3',4'-tetracarboxylic acid residue, and a 4,4'-(hexafluoroisopropylidene)diphthalic acid residue; and $R^{10}$ represents a divalent group which is a diamine residue. The "n'" represents the number of repeating units, and is 1 or more.

In the general formula (5), $R^5$ is a tetracarboxylic acid residue, and may be a residue obtained by excluding an acid dianhydride structure from a tetracarboxylic acid dianhydride as exemplified above. Among them, examples of $R^5$ in the general formula (5) preferably includes at least one kind selected from the group consisting of a 4,4'-(hexafluoroisopropylidene)diphthalic acid residue, a 3,3',4,4'-biphenyltetracarboxylic acid residue, pyromellitic acid residue, a 2,3',3,4'-biphenyltetracarboxylic acid residue, a 3,3',4,4'-benzophenone tetracarboxylic acid residue, a 3,3',4,4'-diphenylsulfone tetracarboxylic acid residue, a 4,4'-oxydiphthalic acid residue, a cyclohexane tetracarboxylic acid residue, and a cyclopentane tetracarboxylic acid residue, from the viewpoint of improved light transmissivity and improved stiffness. It is further preferable to include at least one kind selected from the group consisting of a 4,4'-(hexafluoroisopropylidene)diphthalic acid residue, a 4,4'-oxydiphthalic acid residue and a 3,3',4,4'-diphenylsulfone tetracarboxylic acid residue.

In $R^5$, these preferable residues are preferably included in total of 50 mol % or more, more preferably 70 mol % or more, and further preferably 90 mol % or more.

Also, as $R^5$, it is also preferable to use a mixture of the followings: a tetracarboxylic acid residue group suitable for improving rigidity (Group A) such as at least one kind selected from the group consisting of a 3,3',4,4'-biphenyltetracarboxylic acid residue, a 3,3',4,4'-benzophenone tetracarboxylic acid residue, and a pyromellitic acid residue; and a tetracarboxylic acid residue group suitable for improving transparency (Group B) such as at least one kind selected from the group consisting of a 4,4'-(hexafluoroisopropylidene)diphthalic acid residue, a 2,3',3,4'-biphenyltetracarboxylic acid residue, a 3,3', 4,4'-diphenylsulfone tetracarboxylic acid residue, a 4,4'-oxydiphthalic acid residue, a cyclohexane tetracarboxylic acid residue, and a cyclopentane tetracarboxylic acid residue.

In this case, in relation to the content ratio of the tetracarboxylic acid residue group suitable for improving the rigidity (Group A) and the tetracarboxylic acid residue group suitable for improving transparency (Group B), the tetracarboxylic acid residue group suitable for improving rigidity (Group A) is preferably 0.05 mol or more and 9 mol or less, more preferably 0.1 mol or more and 5 mol or less, and further preferably 0.3 mol or more and 4 mol or less, with respect to 1 mol of the tetracarboxylic acid residue group suitable for improving transparency (Group B).

Among them, $R^6$ in the general formula (5) is preferably at least one kind of divalent group selected from the group consisting of a 4,4'-diaminodiphenylsulfone residue, a 3,4'-diaminodiphenylsulfone residue, and a divalent group represented by the general formula (6); and is further preferably at least one kind of divalent group selected from the group consisting of a 4,4'-diaminodiphenylsulfone residue, a 3,4'-diaminodiphenylsulfone residue, and a divalent group represented by the general formula (6) wherein $R^7$ and $R^8$ are a perfluoroalkyl group, from the viewpoint of improved light transmissivity and improved stiffness.

Among them, from the viewpoint of improved light transmissivity and improved stiffness, $R^9$ in the general formula (7) preferably includes a 4,4'-(hexafluoroisopropylidene) diphthalic acid residue, a 3,3', 4,4'-diphenylsulfontetracarboxylic acid residue, and oxydiphthalic acid residue.

The $R^9$ preferably includes 50 mol % or more, more preferably 70 mol % or more, and further preferably 90 mol % or more of these preferable residues.

The $R^{10}$ in the general formula (7) is a diamine residue, and may be a residue obtained by excluding two amino groups from a diamine as exemplified above. Among them, from the viewpoint of improved light transmissivity and improved stiffness, $R^6$ in the general formula (3) preferably includes at least one kind of divalent group selected from the group consisting of a 2,2'-bis(trifluoromethyl)benzidine residue, a bis[4-(4-aminophenoxy)phenyl]sulfone residue, a 4,4'-diaminodiphenylsulfone residue, a 2,2-bis[4-(4-aminophenoxy)phenyl]hexafluoropropane residue, a bis[4-(3-aminophenoxy)phenyl]sulfone residue, a 4,4'-diamino-2,2'-bis(trifluoromethyl)diphenylether residue, a 1,4-bis[4-amino-2-(trifluoromethyl)phenoxy]benzene residue, a 2,2-bis[4-(4-amino-2-trifluoromethylphenoxy)phenyl] hexafluoropropane residue, a 4,4'-diamino-2-(trifluoromethyl)diphenyl ether residue, a 4,4'-diaminobenzanilide residue, a N,N'-bis(4-aminophenyl) terephthalamide residue and a 9,9-bis(4-aminophenyl) fluorene residue; and further preferably includes at least one kind of divalent group selected from the group consisting of a 2,2'-bis(trifluoromethyl)benzidine residue, a bis[4-(4-aminophenoxy)phenyl]sulfone residue, and a 4,4'-diaminodiphenylsulfone residue.

In $R^{10}$, these preferable residues are preferably included in total of 50 mol % or more, more preferably 70 mol % or more, and further preferably 90 mol % or more.

Also, as $R^{10}$, it is also preferable to use a mixture of the followings: a diamine residue group suitable for improving rigidity (Group C) such as at least one kind selected from the group consisting of a bis[4-(4-aminophenoxy)phenyl] sulfone residue, a 4,4'-diaminobenzanilide residue, a N,N'-bis(4-aminophenyl) terephthalamide residue, a paraphenylenediamine residue, a metaphenylenediamine residue, and a 4,4'-diaminodiphenylmethane residue; and a diamine residue group suitable for improving transparency (Group D) such as at least one kind selected from the group consisting of a 2,2'-bis(trifluoromethyl)benzidine residue, a 4,4'-diaminodiphenyl sulfone residue, a 2,2-bis[4-(4-aminophenoxy)phenyl] hexafluoropropane residue, a bis[4-(3-aminophenoxy)phenyl] sulfone residue, a 4,4'-diamino-2,2'-bis(trifluoromethyl)diphenylether residue, a 1,4-bis[4-amino-2-(trifluoromethyl)phenoxy] benzene residue, a 2,2-bis[4-(4-amino-2-trifluoromethylphenoxy)phenyl] hexafluoropropane residue, a 4,4'-diamino-2(trifluoromethyl)dipenylether residue, and a 9,9-bis(4-aminophenyl) fluorene residue.

In this case, in relation to the content ratio of the diamine residue group suitable for improving the rigidity (Group C) and the diamine residue group suitable for improving transparency (Group D), the diamine residue group suitable for improving rigidity (Group C) is preferably 0.05 mol or more and 9 mol or less, more preferably 0.1 mol or more and 5 mol or less, and further preferably 0.3 mol or more and 4 mol or less, with respect to 1 mol of the diamine residue group suitable for improving transparency (Group D).

In the structure represented by the general formula (5) and the general formula (7), "n" and "n'" each independently represents the number of repeating units, and is 1 or more. The number of repeating units "n" in the polyimide may be appropriately selected according to the structure so as to exhibit preferable glass transition temperature described later, and is not particularly limited. The average number of repeating units is usually 10 to 2000, and is preferably 15 to 1000.

Also, the polyimide based resin may include a polyamide structure in a part thereof. Examples of the polyamide structure that may be included may include a polyamideimide structure including a tricarboxylic acid residue such as trimellitic acid anhydride; and a polyamide structure including a dicarboxylic acid residue such as terephthalic acid.

Form the viewpoint of the heat resistance, the glass transition temperature of the polyimide based resin is preferably 250° C. or more, and more preferably 270° C. or more. Meanwhile, from the viewpoint of easiness of drawing and reduction of the baking temperature, the glass transition temperature is preferably 400° C. or less, and more preferably 380° C. or less.

Examples of the polyimide based resin may include a compound having a structure represented by the following chemical formula. The "n" in the following chemical formula is the number of repeating units, and represent an integer of 2 or more.

[Chemical 8]

(8)

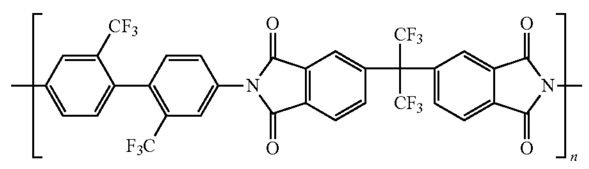

[Chemical 9]

(9)

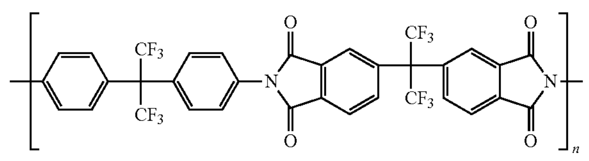

[Chemical 10]

(10)

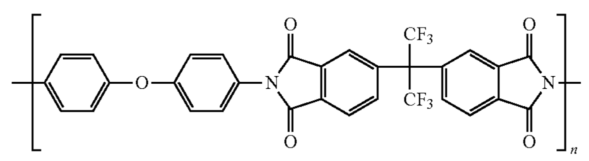

[Chemical 11]

(11)

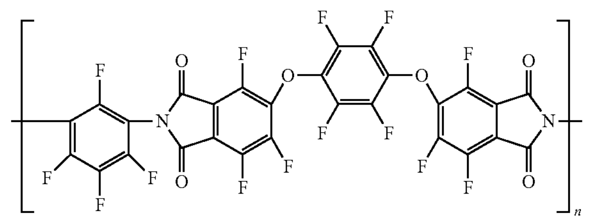

[Chemical 12]

(12)

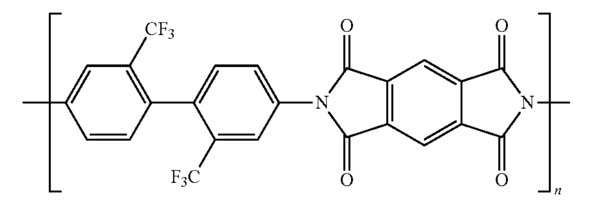

-continued

[Chemical 13]

(13)

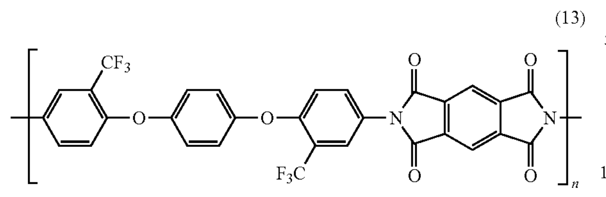

[Chemical 14]

(14)

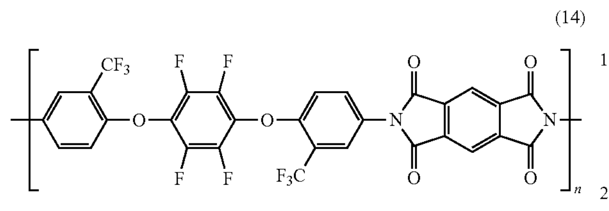

[Chemical 15]

(15)

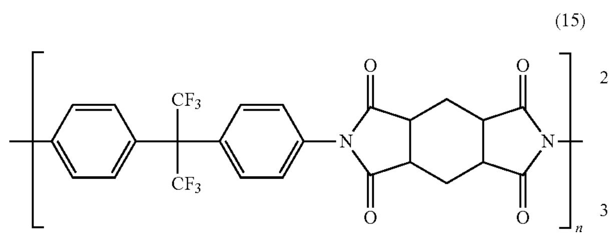

[Chemical 16]

(16)

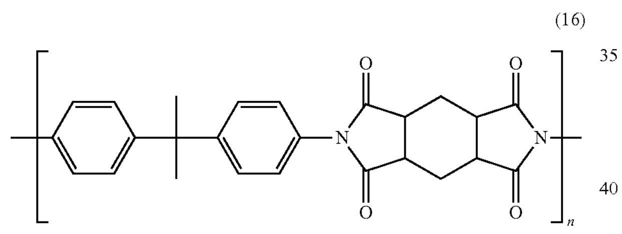

[Chemical 17]

(17)

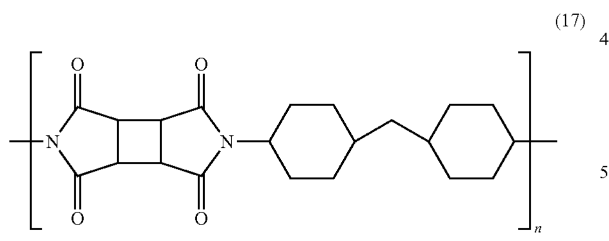

[Chemical 18]

(18)

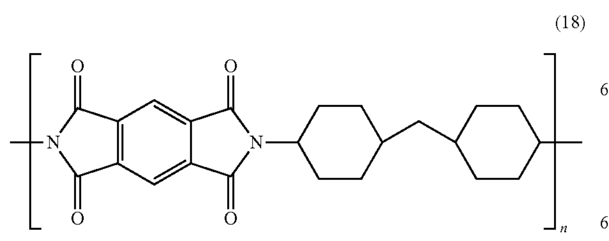

-continued

[Chemical 19]

(19)

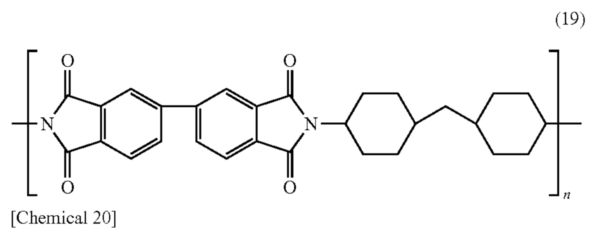

[Chemical 20]

(20)

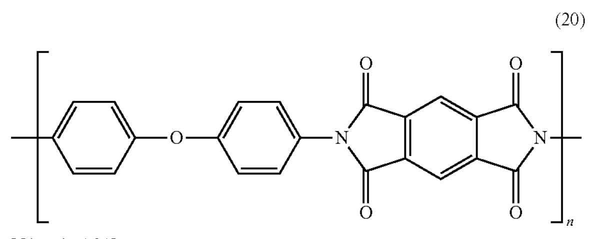

[Chemical 21]

(21)

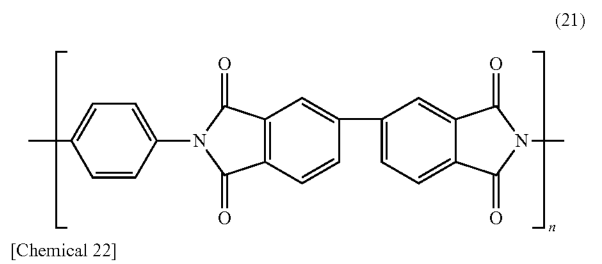

[Chemical 22]

(22)

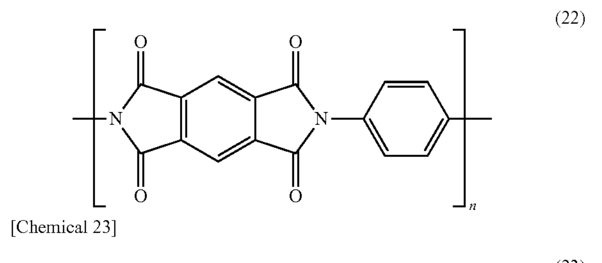

[Chemical 23]

(23)

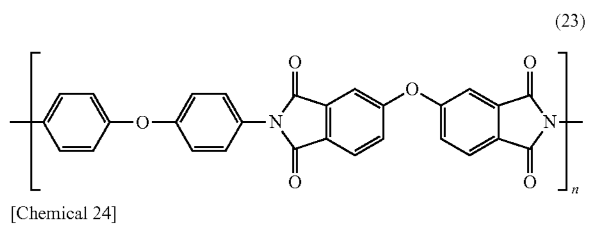

[Chemical 24]

(24)

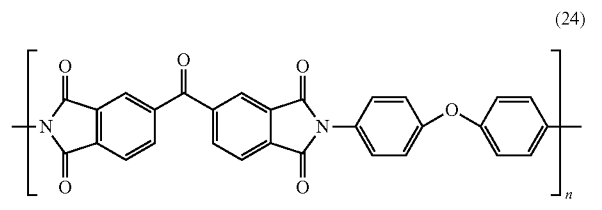

Among the polyimide based resin, a polyimide based resin or a polyamide based resin including a structure wherein a charge transfer within a molecule or between molecules is less likely to occur, is preferable for the excellent transparency. Specific examples may include a fluorinated polyimide based resin such as the chemical formula (8) to (15); and a polyimide based resin including an alicyclic structure such as the formula (15) to (19).

Also, since the fluorinated polyimide based resin such as the chemical formulas (8) to (15) include a fluorinated structure, they have high heat resistance, and they have excellent transparency since they are not colored due to the heat during the production of the polyimide film including the polyimide based resin.

The polyamide based resin is a concept including not only a aliphatic polyamide but also an aromatic polyamide (aramid). Examples of the polyamide based resin may include a compound having a skeleton represented by the following chemical formulas (25) to (27). Incidentally, "n" in the following formula is the number of repeating units, and represents an integer of 2 or more.

[Chemical 25]

(25)

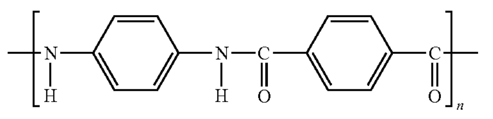

[Chemical 26]

(26)

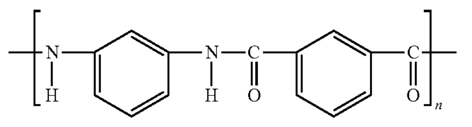

[Chemical 27]

(27)

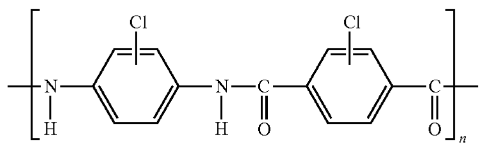

A commercially available product may be used for the substrate including the polyimide based resin or the polyamide based resin represented by the chemical formulas (8) to (24), and (27). Examples of the commercially available polyimide based resin may include Neopulim (registered trademark) from Mitsubishi Gas Chemical Company, Inc., and examples of the commercially available substrate including the polyamide based resin may include Mictron (registered trademark) from Toray Industries, Inc.

Also, for the polyimide based resin or the polyamide based resin represented by the chemical formulas (8) to (24), and (27), those synthesized according to known methods may be used. For example, a method for synthesizing the polyimide based resin represented by the chemical formulas (8) is disclosed in JP-A No. 2009-132091. Specifically, it may be obtained by reacting 4,4'-hexafluoropropylidene bisphthalic acid dianhydride (FPA) represented by the chemical formula (28), and 2,2'-bis(trifluoromethyl)-4,4'-diaminobiphenyl (TFDB).

[Chemical 28]

(28)

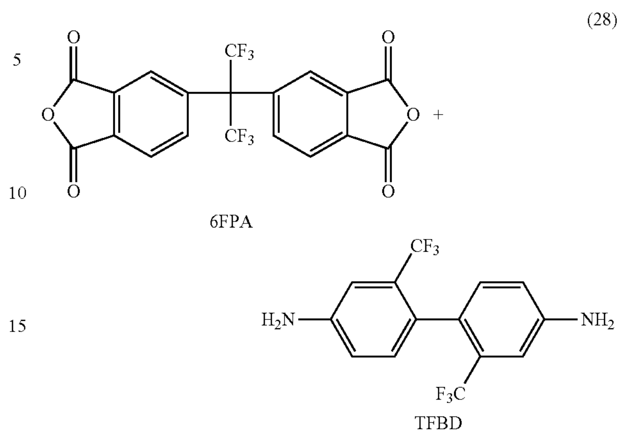

6FPA

TFBD

The weight average molecular weight of the polyimide based resin or the polyamide based resin is preferably in a range of 3000 or more and 500,000 or less, more preferably in a range of 5000 or more and 300,000 or less, and further preferably in a range of 10,000 or more and 200,000 or less. When the weight average molecular weight is less than 3000, sufficient strength may not be obtained, and when the weight average molecular weight is more than 500,000, the viscosity is increased, and the solubility is decreased, so that a substrate having a smooth surface and uniform thickness may not be obtained in some cases. Incidentally, in the present specification, "weight average molecular weight" is a value determined in terms of polystyrene measured with a gel permeation chromatography (GPC).

From the viewpoint of being able to improve the hardness, the resin substrate 51 preferably uses a substrate including a fluorinated polyimide based resin represented by the chemical formulas (8) to (15), for example, or a polyamide based resin including a halogen group such as the chemical formula (27). Among these, from the viewpoint of being able to further improve the hardness, it is more preferable to use a substrate including a polyimide based resin represented by the chemical formula (8).

Examples of the polyester based resin may include resins including at least one of polyethylene terephthalate, polypropylene terephthalate, polybutylene terephthalate, and polyethylene naphthalate, as a constituting component.

The thickness of the resin substrate 51 is preferably 10 μm or more and 100 μm or less. When the thickness of resin substrate 51 is 10 μm or more, curling of the optical film 50 may be suppressed, sufficient hardness may be obtained, and furthermore, even when the optical film 50 is produced by Roll to Roll, wrinkles are less likely to occur, and the appearance is not deteriorated. Meanwhile, when the thickness of the resin substrate 51 is 100 μm or less, the folding property of the optical film 50 is good, the requirements of the consecutive folding test may be satisfied, and it is preferable from the viewpoint of reducing the weight of the optical film 50. The thickness of the resin substrate 51 may be measured by a method similar to the film thickness of the resin layer 10. The lower limit of the resin substrate 51 is more preferably 20 μm or more, 30 μm or more, or 40 μm or more, and the upper limit of the resin substrate 51 is more preferably 80 μm or less, or 50 μm or less.

<<Functional Layer>>

Since the functional layer 52 is the same as the functional layer 31, the explanation thereof is omitted here.

<<<Method for Producing Resin Layer and Optical Film>>>

The resin layer 10 and the optical films 30 and 50 may be produced as follows. Firstly, one surface of a releasing film is coated with a composition for a resin layer, with a coating device such as a bar coater, to form a coating film.

<<Composition for Resin Layer>>

The composition for a resin layer includes an ionizing radiation curable compound. In addition to the ionizing radiation curable compound, the composition for a resin layer may further include a solvent and a polymerization initiator. Since the ionizing radiation curable compound has been described in the column of the resin layer 10, the explanation thereof is omitted here.

(Solvent)

Examples of the solvent may include alcohols (such as methanol, ethanol, propanol, isopropanol, n-butanol, s-butanol, t-butanol, benzyl alcohol, PGME, ethylene glycol, and diacetone alcohol), ketones (such as acetone, methyl ethyl ketone, methylisobutyl ketone cyclopentanone, cyclohexanone, heptanone, diisobutyl ketone, diethyl ketone, and diacetone alcohol), esters (methyl acetate, ethyl acetate, butyl acetate, n-propyl acetate, isopropyl acetate, methyl formate, and PGMEA), aliphatic hydrocarbons (such as hexane, and cyclohexane), halogenated hydrocarbons (such as methylene chloride, chloroform, and carbon tetrachloride), aromatic hydrocarbons (such as benzene, toluene, and xylene), amides (such as dimethylformamide, dimethylacetamide, and n-methylpyrrolidone), ethers (such as diethyl ether, dioxane, and tetrahydrofuran), and ether alcohols (such as 1-methoxy-2-propanol), carbonates (dimethyl carbonate, diethyl carbonate, and ethyl methyl carbonate). These solvents may be used alone, and 2 kinds or more of them may be used in combination. Among these, methyl isobutyl ketone and methyl ethyl ketone are preferable as the solvent from the viewpoint of dissolving or dispersing a component such as urethane (meth) acrylate and other additives so as to preferably coat the composition for a resin layer.

(Polymerization Initiator)

The polymerization initiator is a component which is decomposed by an ionizing radiation irradiation to generate radicals to initiate or proceed polymerization (crosslinking) of the polymerizable compound.

The polymerization initiator is not particularly limited as long as it is capable of releasing a substance which initiates radical polymerization by an ionizing radiation irradiation. The polymerization initiator is not particularly limited, and known ones may be used. Specific examples thereof may include acetophenones, benzophenones, mihirabenzoyl benzoates, α-amyloxime esters, thioxanthones, propiophenones, benzyls, benzoins, and acylphosphine oxides. Also, a photosensitizer is preferably mixed and used, and specific examples thereof may include n-butylamine, triethylamine, and poly-n-butylphosphine.

After forming a coating film of the composition for a resin layer, when the composition for a resin layer includes a solvent, the coating film is dried so as to evaporate the solvent by various known methods, for example, by heating at a temperature of 30° C. or more and 120° C. or less for 10 seconds to 120 seconds.

After drying the coating film, the coating film is irradiated with ionizing radiation such as ultraviolet rays to be cured. Then, the releasing film is peeled off to obtain resin layer 10.

Also, when forming optical film 30, a coating film of the composition for a resin layer is dried, and then, the coating film is irradiated with ionizing radiation such as ultraviolet rays to be semi-cured (half-cured). The "semi-curing" in the present specification means that curing practically proceeds upon further irradiation with ionizing radiation.

Thereafter, the semi-cured coating film is coated with a composition for a functional layer for forming functional layer 31 by a coating device such as a bar coater to form a coating film of a composition for a functional layer.

<Compositions for Functional Layer>

The composition for a functional layer comprises a polymerizable compound. Besides the above, the composition for a functional layer may include an ultraviolet absorber, a spectroscopic transmittance modifier, an antifouling agent, inorganic particles, a leveling agent, a solvent, and a polymerization initiator, as necessary. Since the solvent and the polymerization initiator are the same as those of the composition for a resin layer, the explanation thereof is omitted here.

After forming a coating film of a composition for a functional layer, the coating film is dried so as to evaporate the solvent by various known methods, for example, by heating at a temperature of 30° C. or more and 120° C. or less for 10 seconds to 120 seconds.

After drying the coating film of the composition for a functional layer, ionizing radiation such as ultraviolet ray is irradiated to completely cure (full cure) the coating film to form functional layer 31. However, "complete curing" in the present specification means that curing does not practically proceed furthermore, even when irradiated with ionizing radiation. Thereafter, the releasing film is peeled off to obtain optical film 30.

When forming the optical film 50, the functional layer 52 is formed on one surface side of the resin substrate 51. The functional layer 52 may be formed by a method similar to that of the functional layer 31. Then, the resin layer 10 is formed on the resin substrate 51, on the surface opposite to the surface wherein the functional layer 52 is formed, in the same manner as described above. Thus, the optical film 50 may be obtained.

According to the present embodiment, since the shear storage elastic modulus G' of the resin layer 10 at 25° C. and frequency range of 500 Hz or more and 1000 Hz or less is 30 MPa or more and 200 MPa or less, a good impact resistance may be obtained.

Since the glass transition temperature of a resin having a low shear storage elastic modulus G' is usually low, even when the flexibility is good under room temperature environment, the resin becomes hard and brittle under low temperature environment below glass transition temperature. According to the present embodiment, since the glass transition temperature of the resin layer 10 is 50° C. or more, the condition variation of the resin layer 10 under a room temperature environment and a low temperature environment may be suppressed. Therefore, the flexibility of the resin layer 10 may be maintained not only under a room temperature environment but also under a low temperature environment. Thus, good folding property may be obtained.

<<<Image Displaying Device>>>

Figure 6:
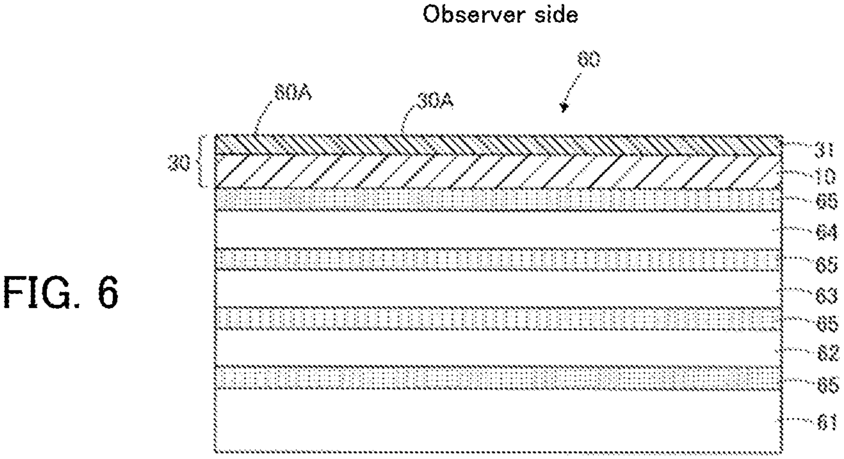
FIG. 6 is a schematic structural view of an image displaying device according to an embodiment.

The optical film 30, 50 may be incorporated into a foldable image displaying device for use. FIG. 6 is a schematic structural view of an image displaying device according to the present embodiment. As illustrated in FIG. 6, in image displaying device 60, housing 61 wherein a battery, for example, is housed; displaying element 62; circularly polarizing plate 63; touch sensor 64; and optical film 30 are mainly stacked in this order, facing to an observer side. Pressure-sensitive adhesive layer 65 or adhesive layer having a light transmissivity is placed between the housing 61 and the displaying element 62; between the displaying element 62 and the circularly polarizing plate 63; between the circularly polarizing plate 63 and the touch sensor 64; and between the touch sensor 64 and the optical film 30, and these members are fixed to each other by the pressure-sensitive adhesive layer 65 or adhesive layer. Incidentally, although the pressure-sensitive adhesive layer 65 is placed between the housing 61 and the displaying element 62; between the displaying element 62 and the circularly polarizing plate 63; between the circularly polarizing plate 63 and the touch sensor 64; and between the touch sensor 64 and the optical film 30, the location of the pressure-sensitive adhesive layer is not particularly limited as long as it is between the optical film and the displaying element.

The optical film 30 is placed so that the functional layer 31 is on the observer side than the resin layer 10. In the image displaying device 60, the surface 30A of the optical film 30 constitutes the surface 60A of the image displaying device 60.

In the image displaying device 60, the displaying element 62 is an organic light emitting diode element including, for example, an organic light emitting diode. The touch sensor 64 is placed on the observer side than the circularly polarizing plate 63, and may be placed between the displaying element 62 and the circularly polarizing plate 63. Also, the touch sensor 64 may be an on-cell type or an in-cell type. As the pressure-sensitive adhesive layer 65, for example, OCAs (Optical Clear Adhesive) may be used.

EXAMPLES

In order to explain the present disclosure in detail, the present disclosure is hereinafter explained with reference to Examples. However, the present disclosure is not limited to these descriptions.

<Preparation of Composition for Hard Coating Layer>

Firstly, composition for hard coating layer 1 was obtained by compounding each component so as to be the composition shown below.

(Composition for Hard Coating Layer 1)

- Mixture of dipentaerythritol pentaacrylate and dipentaerythritol hexaacrylate (product name "M403", from Toagosei Co., Ltd.): 25 parts by mass
- Dipentaerythritol EO-modified hexaacrylate (product name "A-DPH-6E", from Shin-Nakamura Chemical Co., Ltd.): 25 parts by mass
- Deformed silica particles (average particle size of 25 nm, from JGC Catalysts and Chemicals Ltd.) 50 parts by mass (value in terms of 100% solid content)
- Polymerization initiator (1-hydroxycyclohexylphenyl ketone, product name "Omnirad184", from IGM Resins B. V.): 4 parts by mass
- Fluorine based leveling agent (product name "F568" from DIC Corporation): 0.2 parts by mass (value in terms of 100% solid content)
- Methyl isobutyl ketone (MIBK): 150 parts by mass <Composition for Resin Layer>

A composition for a resin layer was obtained by compounding each component so as to be the composition shown below.

(Composition for Resin Layer 1)

- Urethane acrylate (product name "UV-3310B" from Mitsubishi Chemical Corporation): 90 parts by mass

- Cyclic trimethylolpropane formal acrylate (product name "Viscoat #200", from Osaka Organic Chemical Industry Ltd.): 10 parts by mass
- Polymerization initiator (1-hydroxycyclohexylphenyl ketone, product name "Omnirad184", from IGM Resins B. V.): 5 parts by mass
- Methyl isobutyl ketone: 10 parts by mass (Composition for Resin Layer 2)

- Urethane acrylate (product name "UV-3310B" from Mitsubishi Chemical Corporation): 40 parts by mass
- Ethoxylated pentaerythritol tetraacrylate (product name "ATM-35E, from Shin-Nakamura Chemical Co., Ltd.): 5 parts by mass
- Phenoxyethyl acrylate (product name "Viscoat #192", from Osaka Organic Chemical Industry Ltd.): 5 parts by mass
- Mixture of pentaerythritol triacrylate and pentaerythritol tetraacrylate (product name "KAYARAD PET-30" from Nippon Kayaku Co., Ltd.): 50 parts by mass
- Polymerization initiator (1-hydroxycyclohexylphenyl ketone, product name "Omnirad184", from IGM Resins B. V.): 5 parts by mass
- Methyl isobutyl ketone: 10 parts by mass (Composition for Resin Layer 3)

- Urethane acrylate (product name "UV-3310B" from Mitsubishi Chemical Corporation): 35 parts by mass
- Ethoxylated pentaerythritol tetraacrylate (product name "ATM-35E, from Shin-Nakamura Chemical Co., Ltd.): 10 parts by mass
- Phenoxyethyl acrylate (product name "Viscoat #192", from Osaka Organic Chemical Industry Ltd.): 5 parts by mass
- Mixture of pentaerythritol triacrylate and pentaerythritol tetraacrylate (product name "KAYARAD PET-30" from Nippon Kayaku Co., Ltd.): 50 parts by mass
- Polymerization initiator (1-hydroxycyclohexylphenyl ketone, product name "Omnirad184", from IGM Resins B. V.): 5 parts by mass
- Methyl isobutyl ketone: 10 parts by mass (Composition for Resin Layer 4)

- Urethane acrylate (product name "UV-3310B" from Mitsubishi Chemical Corporation): 25 parts by mass
- Ethoxylated pentaerythritol tetraacrylate (product name "ATM-35E, from Shin-Nakamura Chemical Co., Ltd.): 20 parts by mass
- Phenoxyethyl acrylate (product name "Viscoat #192", from Osaka Organic Chemical Industry Ltd.): 5 parts by mass
- Mixture of pentaerythritol triacrylate and pentaerythritol tetraacrylate (product name "KAYARAD PET-30" from Nippon Kayaku Co., Ltd.): 50 parts by mass
- Polymerization initiator (1-hydroxycyclohexylphenyl ketone, product name "Omnirad184", from IGM Resins B. V.): 5 parts by mass
- Methyl isobutyl ketone: 10 parts by mass (Composition for Resin Layer 5)

- Urethane acrylate (product name "UV-3310B" from Mitsubishi Chemical Corporation): 15 parts by mass
- Ethoxylated pentaerythritol tetraacrylate (product name "ATM-35E, from Shin-Nakamura Chemical Co., Ltd.): 30 parts by mass
- Dicyclopentanylacrylate (product name "FA-513AS", from Showa Denko Materials Co., Ltd. (former Hitachi Chemical): 5 parts by mass
- Dipentaerythritol hexaacrylate (product name "KAYARAD DPHA" from Nippon Kayaku Co., Ltd.): 50 parts by mass Polymerization initiator (1-hydroxycyclohexylphenyl ketone, product name "Omnirad184", from IGM Resins B. V.): 5 parts by mass Methyl isobutyl ketone: 10 parts by mass (Composition for Resin Layer 6)

Urethane acrylate (product name "UV-3310B" from Mitsubishi Chemical Corporation): 90 parts by mass 2-Propenoic acid, homopolymer, mono (tetrahydro-2-furanyl) methyl ester (product name "Viscoat #150D", from Osaka Organic Chemical Industry Ltd.): 10 parts by mass Polymerization initiator (1-hydroxycyclohexylphenyl ketone, product name "Omnirad184". from IGM Resins B. V.): 5 parts by mass Methyl isobutyl ketone: 10 parts by mass (Composition for Resin Layer 7)

Urethane acrylate (product name "UV-3310B" from Mitsubishi Chemical Corporation): 40 parts by mass Ethoxylated pentaerythritol tetraacrylate (product name "ATM-35E, from Shin-Nakamura Chemical Co., Ltd.): 5 parts by mass Phenoxyethyl acrylate (product name "Viscoat #192", from Osaka Organic Chemical Industry Ltd.): 5 parts by mass Dipentaerythritol hexaacrylate (product name "KAYARAD DPHA" from Nippon Kayaku Co., Ltd.): 50 parts by mass Polymerization initiator (1-hydroxycyclohexylphenyl ketone, product name "Omnirad184", from IGM Resins B. V.): 5 parts by mass Methyl isobutyl ketone: 10 parts by mass (Composition for Resin Layer 8)

Urethane acrylate (product name "UV-3310B" from Mitsubishi Chemical Corporation): 30 parts by mass Ethoxylated pentaerythritol tetraacrylate (product name "ATM-35E, from Shin-Nakamura Chemical Co., Ltd.): 60 parts by mass Dicyclopentanylacrylate (product name "FA-513AS", from Showa Denko Materials Co., Ltd. (former Hitachi Chemical): 10 parts by mass Polymerization initiator (1-hydroxycyclohexylphenyl ketone, product name "Omnirad184", from IGM Resins B. V.): 5 parts by mass Methyl isobutyl ketone: 10 parts by mass (Composition for Resin Layer 9)

Urethane acrylate (product name "UV-3310B" from Mitsubishi Chemical Corporation): 80 parts by mass Ethoxylated pentaerythritol tetraacrylate (product name "ATM-35E, from Shin-Nakamura Chemical Co., Ltd.): 10 parts by mass Phenoxyethyl acrylate (product name "Viscoat #192", from Osaka Organic Chemical Industry Ltd.): 10 parts by mass Polymerization initiator (1-hydroxycyclohexylphenyl ketone, product name "Omnirad184", from IGM Resins B. V.): 5 parts by mass Methyl isobutyl ketone: 10 parts by mass

Example 1

As a releasing film, a polyethylene terephthalate substrate (product name "Cosmoshine (registered tradename) A4100" from Toyobo Co., Ltd) having a thickness of 50 μm was prepared. The untreated surface side of the polyethylene terephthalate substrate was coated with the composition for a resin layer 1, with a bar coater to form a coating film. Thereafter, the formed coating film was heated at 70° C. for 1 minute to evaporate the solvent in the coating film, and the coating film was semi-cured (half-cured) in air by irradiating ultraviolet rays with a UV irradiation device (light source H bulb from Fusion UV System Japan K.K) so that the integrated light amount was 100 mJ/cm$^2$, and a resin layer of thickness of 100 μm including an urethane based resin was formed.

Then, the surface of the semi-cured coating film was coated with the composition for a hard coating layer 1 with a bar coater to form a coating layer. Thereafter, the formed coating film was heated at 70° C. for 1 minute to evaporate the solvent in the coating film, and the coating film was completely cured (full cured) by irradiating ultraviolet rays with a UV irradiation device (light source H bulb from Fusion UV System Japan K.K) under the condition of an oxygen concentration of 200 ppm or less so that the integrated light amount was 300 mJ/cm$^2$. Thus, a hard coating layer having a thickness of 5 μm was formed.

Thereafter, the resin layer was peeled off from the polyethylene terephthalate substrate. Thereby, an optical film including the resin layer including a urethane based resin and a hard coating layer was obtained.

The thickness of each layer was obtained as the arithmetic average value of the thickness of ten locations obtained by photographing the cross-section of the optical film using a scanning transmission type electron microscope (STEM) (tradename "S-4800", from Hitachi High-Tech Corporation), and measuring the thickness of each layer in the image of the cross-section at 10 locations. The cross-sectional photograph of the optical film was photographed as described below. Firstly, a block wherein an optical film cut out to a size of 1 mm×10 mm was embedded in an embedding resin was prepared, and a uniform section having a thickness of 70 nm or more and 100 nm or less without a hole, for example, was cut out from this block by a common section preparing method. For the preparation of the section, an ultramicrotome EM UC7 from Leica Microsystems, Inc. was used. Then, this uniform section without a hole, for example, was used as a measurement sample. Thereafter, a cross-sectional photograph of the measurement sample was taken using a scanning transmission type electron microscope (STEM). When the cross-sectional photograph of each layer was taken, STEM observation was carried out by setting the detector to "TE", the acceleration voltage to "30 kV", and the emission current to "10 μA". Regarding magnification, the focus was adjusted, and the contrast and brightness were appropriately adjusted by a factor of 100 to 100,000 while observing whether each layer was able to be distinguished. Regarding magnification, the focus was adjusted, and the contrast and brightness were appropriately adjusted by a factor of 5000 to 200,000 while observing whether each layer was able to be distinguished. Incidentally, upon STEM observation, the beam monitor aperture was further set to "3", the objective lens aperture was set to "3", also W.D. was set to "8 mm". The thickness of each layer in Examples 2 to 10 and Comparative Examples 1 to 4 was also measured in the same manner as in Example 1.

Example 2

An optical film was obtained in the same manner as in Example 1 except that, instead of the composition for a resin layer 1, the composition for a resin layer 2 was used in Example 2.

Example 3

An optical film was obtained in the same manner as in Example 1 except that, instead of the composition for a resin layer 1, the composition for a resin layer 3 was used in Example 3.

Example 4

An optical film was obtained in the same manner as in Example 1 except that, instead of the composition for a resin layer 1, the composition for a resin layer 4 was used in Example 4.

Example 5

An optical film was obtained in the same manner as in Example 1 except that, instead of the composition for a resin layer 1, the composition for a resin layer 5 was used in Example 5.

Example 6

An optical film was obtained in the same manner as in Example 2 except that the thickness of the resin layer was 40 μm in Example 6.

Example 7

An optical film was obtained in the same manner as in Example 2 except that the thickness of the resin layer was 25 μm in Example 7.

Example 8

An optical film was obtained in the same manner as in Example 2 except that the thickness of the resin layer was 75 μm in Example 8.

Example 9

An optical film was obtained in the same manner as in Example 2 except that the thickness of the resin layer was 140 μm in Example 9.

Example 10

An optical film was obtained in the same manner as in Example 2 except that the thickness of the resin layer was 160 μm in Example 10.

Comparative Example 1

An optical film was obtained in the same manner as in Example 1 except that, instead of the composition for a resin layer 1, the composition for a resin layer 6 was used in Comparative Example 1.

Comparative Example 2

An optical film was obtained in the same manner as in Example 1 except that, instead of the composition for a resin layer 1, the composition for a resin layer 7 was used in Comparative Example 2.

Comparative Example 3

An optical film was obtained in the same manner as in Example 1 except that, instead of the composition for a resin layer 1, the composition for a resin layer 8 was used in Comparative Example 3.

Comparative Example 4

An optical film was obtained in the same manner as in Example 1 except that, instead of the composition for a resin layer 1, the composition for a resin layer 9 was used in Comparative Example 4.

<Shear Storage Elastic Modulus G' Measurement>

The shear storage elastic modulus G' of the optical films according to Examples and Comparative Examples was measured. Specifically, firstly, the optical film was punched out into a rectangular shape of 10 mm×5 mm to obtain a sample. Then, two pieces of this sample were prepared, and were installed into a solid shear jig which is an option of the dynamic mechanical analyzing device (tradename "Rheogel-E4000" from UBM Corporation). Specifically, solid shear jig was provided with one metal solid shear plate having a thickness of 1 mm, and two L-shaped metal fittings placed on both sides of this solid shear plate; one of the sample was sandwiched between the solid shear plate and one L-shaped metal fitting, and the other sample was sandwiched between the solid shear plate and the other L-shaped metal fitting. In this case, the sample was sandwiched so as the resin layer was on the solid Shea plate side, and the hard coating layer was on the L-shaped metal fitting side. Then, the sample was fixed by screwing between the L-shaped metal fittings with screw. Then, after installing a tensile test chuck including an upper chuck and lower chuck into a dynamic mechanical analyzing device (tradename "Rheogel-E4000" from UBM Corporation), the solid shear jig was installed between the upper chuck and the lower chuck, at distance between chucks of 20 mm. Then, temperature was set to 25° C., and the temperature was raised at 2° C./min. Under this condition, the shear storage elastic modulus G' of the optical film was measured by applying longitudinal vibrations with a strain amount of 1% and frequency range of 500 Hz or more and 1000 Hz or less, to the two L-shaped metal fittings while fixing the solid shear plate, thereby dynamic mechanical analysis of the solid at 25° C. was carried out. Here, the shear storage elastic modulus G' of the optical film at frequency range of 500 Hz or more and 1000 Hz or less was the value obtained as follows; the shear storage elastic modulus G' of the optical film was measured at respective frequency of 500 Hz, 750 Hz, and 950 Hz while applying longitudinal vibration of the respective frequency to the L-shaped metal fitting, to obtain the arithmetic average value of these shear storage elastic modulus G', further, this measurement was repeated for three times, and the arithmetic average value of the arithmetic average value of the respectively obtained three measurements was regarded as the shear storage elastic modulus G'. Incidentally, since the resin layer was softer than the hard coating layer in the optical film, the shear storage elastic modulus G' of the optical film may be regarded as the shear storage elastic modulus G' of the resin layer.

<Glass Transition Temperature Tg Measurement>

The glass transition temperature Tg of the optical films according to Examples and Comparative Examples was measured. Specifically, firstly, a sample having the same size as the sample used in the measurement of the shear storage elastic modulus G' was obtained from an optical film, and the sample was installed into the dynamic mechanical analyzing device (tradename "Rheogel-E4000" from UBM Corporation) in the same manner as in the measurement of the shear storage elastic modulus G'. Then, the temperature was set to −50° C., and the temperature was raised at 2° C./min. Under this condition, the shear loss tangent tan δ of the optical film was measured by applying longitudinal vibrations with a strain amount of 1% and frequency range of 500 Hz or more and 1000 Hz or less, to the two L-shaped metal fittings while fixing the solid shear plate, and carried out a dynamic mechanical analysis of the solid. Here, the shear loss tangent tan δ of the optical film at frequency range of 500 Hz or more and 1000 Hz or less was the value obtained as follows; the shear loss tangent tan δ of the optical film was measured at respective frequency of 500 Hz, 750 Hz, and 950 Hz while applying longitudinal vibration of the respective frequency to the L-shaped metal fitting, to respectively determine the temperature at which it reaches a peak, from these shear loss tangent tan δ, so as to determine the arithmetic average value of the glass transition temperature. Further, this measurement was repeated for three times, and the arithmetic average value of the arithmetic average value of the respectively obtained three measurements was regarded as the shear loss tangent tan δ. Incidentally, since the resin layer was softer than the hard coating layer in the optical film, the glass transition temperature Tg of the optical film may be regarded as the glass transition temperature Tg of the resin layer.

<Impact Resistance Test>

Using the optical films according to Examples and Comparative Examples, an impact resistance test was carried out. Specifically, the optical film according to Examples and Comparative Examples was directly placed on the surface of a soda glass of thickness of 0.7 mm so as the hard coating layer side was upper side, and an impact resistance test wherein an iron ball of weight of 100 g and diameter of 30 mm was dropped onto the surface of the hard coating layer of the optical film from a height of 30 cm, was carried out for three times each. Incidentally, in the impact resistance test, the location where the iron ball was dropped, was changed every time. Then, for the optical film after the impact resistance test, whether the surface of the hard coating layer was recessed or not was visually evaluated. The results were evaluated as follows.

A: a recess was not confirmed on the surface of the hard coating layer, in both cases where the hard coating layer was observed from the front and from the oblique direction.

B: although a recess was confirmed on the surface of the hard coating layer, in either one of the cases where the hard coating layer was observed from the front and from the oblique direction, it was not a practical problem.

C: although a recess was not confirmed on the surface of the hard coating layer when the hard coating layer was observed from the front, a recess was confirmed on the surface of the hard coating layer when observed from the oblique direction.

D: an obvious recess was confirmed on the surface of the hard coating layer, in both cases where the hard coating layer was observed from the front and from the oblique direction.

<Folding Property>

For the optical films according to Examples and Comparative Examples, a consecutive folding test was carried out, and a folding property was evaluated. Specifically, firstly, a sample having a size of 30 mm×100 mm was cut out from an optical film. Then, the two opposing side portions of the cut-out sample were respectively fixed with fixing portions of a parallelly arranged folding resistance tester (such as product name "U-shaped folding tester DLDMLH-FS", IEC62715-6-1 compliant from Yuasa System Co., Ltd.). Then, as illustrated in FIG. 4C, a consecutive folding test wherein the optical film was folded by 180°, was repeatedly carried out for 100,000 times under the following conditions, so as the minimum distance φ between the two opposing side portions was 10 mm, and so as the surface side of the optical film (hard coating layer side) faced the outer side, and whether a deformation, a crack, or a breakage occurred at the bent portion or not was checked. The consecutive folding test was respectively carried out under room temperature environment of room temperature (23° C.) and relative humidity of 50%, and under low temperature environment of a low temperature (−40° C.). The results were evaluated as follows.

A: a deformation, a crack, or a breakage did not occur at the bent portion in the consecutive folding test.

B: although a deformation which was not a practical problem was confirmed at the bent portion in the consecutive folding test, a crack, or a breakage did not occur.

C: although an obvious deformation was confirmed at the bent portion in the consecutive folding test, a crack, or a breakage did not occur.

D: a crack, or a breakage occurred at the bent portion in the consecutive folding test.

<Pencil Hardness>

The pencil hardness of the surface of the optical films (the surface of the hard coating layer) according to Examples and Comparative Examples was measured respectively based on JIS K5600-5-4: 1999. Specifically, firstly, an optical film cut out to a size of 30 mm×100 mm was fixed on a glass plate having the thickness of 2 mm, with cello tape (registered trademark) from Nichiban Corporation so that there is no breakage or wrinkles. Then, using a pencil hardness tester (product name "Pencil scratch coating film hardness tester (electric type)", from Toyo Seiki Co., Ltd.), and under environment of a temperature of 23° C. and a relative humidity of 50%, a pencil (product name "Uni", from Mitsubishi Pencil Corporation) was moved at a speed of 1 mm/sec while applying a load of 750 g to the pencil. The pencil hardness shall be the highest hardness at which the surface of the optical film (the surface of the hard coating layer) was not bruised in the pencil hardness test. Incidentally, when measuring the pencil hardness, a plurality of pencils with different hardness were used. However, the pencil hardness test was carried out for five times per pencil, and when a bruise was not visually observed on the surface of the optical film through a transmissive observation of the surface of the optical film under a fluorescent lamp in 4 tests or more out of 5 tests, it was determined that the surface of the optical film was not bruised with this pencil hardness.

Hereinafter, the results are shown in Table 1 below.

TABLE 1

| | Shear storage elastic modulus G' (MPa) | Glass transition temperature Tg (° C.) | Folding property Room temp. | Folding property Low temp. | Impact resistance | Pencil hardness |
|---|---|---|---|---|---|---|
| Example 1 | 200 | 53 | A | B | A | 4H |
| Example 2 | 121 | 86 | A | A | A | 3H |
| Example 3 | 104 | 79 | A | A | A | 3H |
| Example 4 | 73 | 68 | A | A | B | 3H |
| Example 5 | 55 | 53 | A | B | B | 2H |
| Example 6 | 121 | 86 | A | A | B | 3H |
| Example 7 | 121 | 86 | A | A | B | 4H |
| Example 8 | 121 | 86 | A | A | A | 3H |
| Example 9 | 121 | 86 | A | B | A | 3H |
| Example 10 | 121 | 86 | B | B | A | 2H |
| Comp. Ex. 1 | 180 | 40 | A | D | A | 3H |
| Comp. Ex. 2 | 250 | 140 | D | A | A | 4H |
| Comp. Ex. 3 | 14 | 18 | A | D | D | HB |
| Comp. Ex. 4 | 73 | 39 | A | D | B | H |

Hereinafter, the results are described. Since the shear storage elastic modulus G' of the resin layer in the optical film according to Comparative Example 2 was too high, the folding property at the ordinary temperature was inferior, and since the shear storage elastic modulus G' of the resin layer in the optical film according to Comparative Example 3 was too low, the impact resistance was inferior. Also, since the glass transition temperature of the resin layer in the optical film according to Comparative Examples 1 and 4 was too low, the folding property under low temperature environment was inferior, although the folding property under the room temperature environment was good. In contrast to this, since the shear storage elastic modulus G' of the optical film according to Examples 1 to 10 was 30 MPa or more and 200 MPa or less, the impact resistance was good, and since the glass transition temperature of the resin layer was 50° C. or more, the folding property was good not only under the room temperature environment, but also under the low temperature environment.

REFERENCE SIGNS LIST

10: resin layer
30, 50: optical film
31: functional layer
51: resin substrate
52: functional layer
60: image displaying device
62: displaying element

The invention claimed is:

1. An optical film with a foldable stacked structure, the optical film comprising a resin layer and a hard coating layer, wherein a shear storage elastic modulus G' of the resin layer, at 25° C. and frequency range of 500 Hz or more and 1000 Hz or less, is 30 MPa or more and 200 MPa or less;

a glass transition temperature of the resin layer is 50° C. or more and 90° C. or less;

the hard coating layer is provided on one surface side of the resin layer so as to be in contact with the resin layer; and the resin layer comprises a urethane-based resin.

2. The optical film according to claim 1, wherein a thickness is 20 μm or more and 150 μm or less.

3. The optical film according to claim 1, further comprising a resin substrate provided on one surface side of the resin layer.

4. The optical film according to claim 1, wherein a crack or a breakage does not occur in the optical film, when a test wherein the optical film is folded by 180° so as a distance between opposing side portions of the optical film is 10 mm, is repeatedly carried out for 100,000 times under 23° C. environment.

5. The optical film according to claim 4, wherein a crack or a breakage does not occur in the optical film, when a test wherein the optical film is folded by 180° so as a distance between opposing side portions of the optical film is 10 mm, is repeatedly carried out for 100,000 times under −40° C. environment.

6. The optical film according to claim 1, wherein the hard coating layer has a thickness of 3 μm or more and 10 μm or less.

7. The optical film according to claim 1, wherein the hard coating layer comprises a cured product of a composition containing a polyfunctional (meth)acrylate and inorganic particles.

8. An image displaying device comprising a displaying element; and the optical film according to claim 1, placed on an observer side relative to the displaying element.

9. The image displaying device according to claim 8, wherein the displaying element is an organic light emitting diode element.

10. An optical film with a foldable stacked structure, the optical film comprising a resin layer and a hard coating layer, wherein a shear storage elastic modulus G' of the resin layer, at 25° C. and frequency range of 500 Hz or more and 1000 Hz or less, is 30 MPa or more and 200 MPa or less;

a glass transition temperature of the resin layer is 50° C. or more and 90° C. or less;

the hard coating layer is provided on one surface side of the resin layer so as to be in contact with the resin layer; and the resin layer comprises 15 to 90 parts by mass of a urethane (meth)acrylate having 2 to 4 (meth)acryloyl groups and a weight average molecular weight of 1,500 to 20,000.

11. An image displaying device comprising a displaying element; and the optical film according to claim 10, placed on an observer side relative to the displaying element.

12. An optical film with a foldable stacked structure, the optical film comprising a resin layer and a hard coating layer, wherein a shear storage elastic modulus G' of the resin layer, at 25° C. and frequency range of 500 Hz or more and 1000 Hz or less, is 30 MPa or more and 200 MPa or less;

a glass transition temperature of the resin layer is 50° C. or more and 90° C. or less;

the hard coating layer is provided on one surface side of the resin layer so as to be in contact with the resin layer; and the resin layer comprises 5 to 50 parts by mass of a polyfunctional (meth)acrylate selected from pentaerythritol triacrylate, pentaerythritol tetraacrylate, dipentaerythritol pentaacrylate, and dipentaerythritol hexaacrylate.

13. An image displaying device comprising a displaying element; and the optical film according to claim 12, placed on an observer side relative to the displaying element.

14. An optical film with a foldable stacked structure, the optical film comprising a resin layer and a hard coating layer, wherein a shear storage elastic modulus G' of the resin layer, at 25° C. and frequency range of 500 Hz or more and 1000 Hz or less, is 30 MPa or more and 200 MPa or less;

a glass transition temperature of the resin layer is 50° C. or more and 90° C. or less;

the hard coating layer is provided on one surface side of the resin layer so as to be in contact with the resin layer; and the resin layer comprises 5 to 10 parts by mass of a monofunctional (meth)acrylate selected from phenoxyethyl acrylate, dicyclopentanyl acrylate, and isobornyl acrylate.

15. An image displaying device comprising a displaying element; and the optical film according to claim 14, placed on an observer side relative to the displaying element.

* * * * *